United States Patent [19]
Ogiue et al.

[11] Patent Number: 4,858,189
[45] Date of Patent: Aug. 15, 1989

[54] SEMICONDUCTOR INTEGRATED CIRCUIT

[75] Inventors: Katsumi Ogiue; Yukio Suzuki, both of Hinode; Ikuro Masuda, Hitachi; Masanori Odaka, Kodaira; Hideaki Uchida, Takasaki, all of Japan

[73] Assignee: Hitachi, Ltd., Tokyo, Japan

[21] Appl. No.: 121,914

[22] Filed: Nov. 17, 1987

Related U.S. Application Data

[63] Continuation of Ser. No. 701,226, Feb. 13, 1985, Pat. No. 4,713,796.

[30] Foreign Application Priority Data

Feb. 13, 1984 [JP]  Japan ................................ 59-22811

[51] Int. Cl.$^4$ ............................................... G11C 7/00
[52] U.S. Cl. ............................ 365/203; 365/230.03; 365/225.6; 307/446
[58] Field of Search ............... 365/189, 203, 230, 233, 365/177, 190; 307/446, 475, 570

[56] References Cited

U.S. PATENT DOCUMENTS

| | | | |
|---|---|---|---|
| 4,425,516 | 1/1984 | Wanlass | 307/446 |
| 4,507,759 | 3/1985 | Yasui et al. | 365/189 |
| 4,665,505 | 5/1987 | Miyakawa et al. | 365/189 X |
| 4,713,796 | 12/1987 | Ogiue et al. | 365/189 |

FOREIGN PATENT DOCUMENTS 59-8431  1/1984  Japan.
59-25424  2/1984  Japan.

Primary Examiner—Joseph A. Popek
Attorney, Agent, or Firm—Antonelli, Terry & Wands

[57] ABSTRACT

In order to provide high speed and low power consumption, a semiconductor integrated circuit is constructed to utilize both CMOS elements and bipolar transistors. The bipolar transistors are used in the output portions to take advantage of their speed of operation to allow rapid charging and discharging of output lines. In the meantime, the principal operating portions of the circuit use CMOS elements of low power consumption. This arrangement is particularly advantageous in memory circuits.

44 Claims, 9 Drawing Sheets

SEMICONDUCTOR INTEGRATED CIRCUIT

This is a continuation of application Ser. No. 701,226, filed Feb. 13, 1985 now U.S. Pat. No. 4,713,796.

FIELD OF THE INVENTION

The present invention relates to a semiconductor integrated circuit in which memory cells are integrated on a large scale.

BACKGROUND OF THE INVENTION

A well-known type of semiconductor integrated circuit in which memory cells are integrated on a large scale (hereinbelow termed the "semiconductor memory") is the so-called RAM. The RAM (random access memory) is a device capable of storing information temporarily and reading it out when required. This type of memory is also called a "read/write memory".

Typically, a RAM includes memory cells which store information, an address circuit which externally selects a specified memory cell, and a timing circuit which controls the reading and writing of information.

In a RAM, a plurality of memory cells are arranged in the shape of a matrix. The operation of selecting a desired memory cell from among the plurality of memory cells is performed by selecting an intersection point in the matrix. The access time is therefore constant irrespective of the position (addresses) of the selected memory cells within the matrix.

RAMs are broadly classified into two sorts; bipolar RAMs and MOSRAMs.

The bipolar RAM has the following merits:

(1) As compared with the MOSRAM, it operates faster.

(2) The operation of the memory cell is of the static type, and the controls of timings, etc. are simple.

On the other hand, the bipolar RAM has the following demerits:

(3) As compared with the MOSRAM, it exhibits a higher power consumption (especially when it does not operate).

(4) As compared with the MOSRAM, it requires a more complicated manufacturing process and is more difficult to attain a high density of integration.

Bipolar RAMs are presently generally classified into the two types of the TTL type and the ECL type, depending upon differences in input/output levels. The access time (reading time) of the bipolar RAM of TTL interface falls within a range of 30-60 (nsec.), while the access time of the bipolar RAM of ECL interface falls within a range of 4-35 (nsec.).

Accordingly, bipolar RAMs are applied to various memory systems where high speed operations are required.

Meanwhile, when compared with the bipolar RAM, the MOSRAM is simpler in structure and in the manufacturing process. It is also more advantageous in terms of power consumption, storage density and price. Therefore, it is used in fields which do not require high speed operations.

MOSRAMs are classified into the dynamic type and the static type.

The dynamic type MOSRAM has its memory cell composed of a comparatively small number of transistors, namely, 1-3 transistors per bit (1-3 transistors/bit). With an identical chip area, therefore, the bit density becomes higher than that of the static type MOSRAM to be described later.

In the dynamic MOSRAM, information is stored as charges in a capacitance within the memory cell. Since the charges stored in the capacitance are discharged due to a leakage current, etc., the information of the memory cell needs to be read out within a predetermined period of time and to be rewritten again (i.e., refreshed).

On the other hand, in the static MOSRAM, a flip-flop circuit which is usually composed of 6 elements is used as the memory cell. For this reason, the refresh which is required in the dynamic MOSRAM is not necessary.

The access time of the dynamic MOSRAM falls whithin a range of 100-300 (nsec.), while the access time of the static MOSRAM falls within a range of 30-200 (nsec.). Thus, it can be seen that the access time of the MOSRAM is a larger value when compared with that of the bipolar RAM.

Meanwhile, owing to improvements in photolithographic technology, reduction in the element dimensions of MISFETs within a semiconductor integrated circuit has been promoted. In IEEE Journal of Solid-State Circuit, Vol. SC-17, No. 5, pp. 793-797, issued in October 1982, there is contained a static MOSRAM of 64 kbits which employs wafer processing techniques based on design rules of 2 ($\mu$m) and which exhibits an access time of 65 (nsec.), an operating power consumption of 200 (mW) and a stand-by power consumption of 10 ($\mu$W).

Meanwhile, as an example of the bipolar RAM of the ECL type, an ECL type bipolar RAM of 4 kbits which exhibits an access time of 15 (nsec.) and a power consumption of 800 (mW) is manufactured and sold by Hitachi, Ltd. under the product name "HM100474-15".

As explained above, there has been a definite technical trend to enlarge the storage capacity of semiconductor memories which has taken place in the increments of 1 kbit, 4 kbits, 16 kbits, 64 kbits, 256 kbits, 1 Mbit, . . . , quite independently of the features of the bipolar RAM of high speed and high power consumption and the features of the MOSRAM of low speed and low power consumption.

At the present time, when the power consumption of the semiconductor memory and the present-day photolithographic techniques determining the element dimensions of bipolar transistors are taken into consideration, the storage capacity of the bipolar RAM will be limited to 16 kbits.

Meanwhile, with the enlargement of the storage capacity of the semiconductor memory (particularly, at and above 64 kbits), the area of a semiconductor chip increases, and the signal line of the address circuit of the RAM is arranged over a long distance on the semiconductor chip of large area. When the length of the signal line of the address circuit lengthens, naturally the stray capacitance of the signal line increases, and also the equivalent distributed resistance of the signal line increases. When, for the purpose of microminiaturization, the wiring width of the signal line of the address circuit is established as 2 ($\mu$m) or less by improving photolithography, the equivalent distributed resistance of the signal line increases more. In addition, since the fan-out of each circuit enlarges with the increase of the storage capacity, a load capacitance attributed to the gate capacitance of a MOSFET at the succeeding stage becomes high. Accordingly, in the 64-kbit MOSRAM which employs the photolithography of 2 ($\mu$m) and whose address circuit is entirely constructed of CMOSFETs, the access time of addresses will be limited to 30 (nsec.).

The present invention has been made by the inventors in developing a semiconductor memory which has an access time equivalent to that of an ECL type bipolar RAM and a power consumption equivalent to that of a static MOSRAM.

OBJECTS OF THE INVENTION

An object of the present invention is to provide a semiconductor memory of high speed and low power consumption.

The above and other objects and novel features of the present invention will become apparent from the description of the specification and the accompanying drawings.

SUMMARY OF THE INVENTION

An outline of a typical embodiment disclosed in the present application to achieve the above and other objects will be briefly explained below.

In an address circuit, a timing circuit, etc. within a semiconductor memory, an output transistor for charging and discharging a signal line of relatively great length and an output transistor of large fan-out are constructed of bipolar transistors. On the other hand, logic circuits for executing logic processing, for example, inversion, non-inversion, NAND and NOR operations are constructed of CMOS circuits.

The logic circuit constructed of the CMOS circuit has low power consumption, and the output signal of this logic circuit is transmitted to the signal line of relatively great length through the bipolar output transistor of low output impedance. Since the output signal is transmitted to the signal line by the use of the bipolar output transistor having a low output impedance, the dependence of the signal propagation delay time upon the stray capacitance of the signal line can be diminished. Therefore, using the arrangement of the present invention, the object of providing a semiconductor memory of low power consumption and high speed can be achieved.

BRIEF DESCRIPTION OF THE DRAWINGS

in FIG. 1 in greater detail;

in FIG. 1 in greater detail;

in FIG. 1 in greater detail.

DETAILED DESCRIPTION

Now, an embodiment of the present invention will be described with reference to the drawings.

Figure 1:
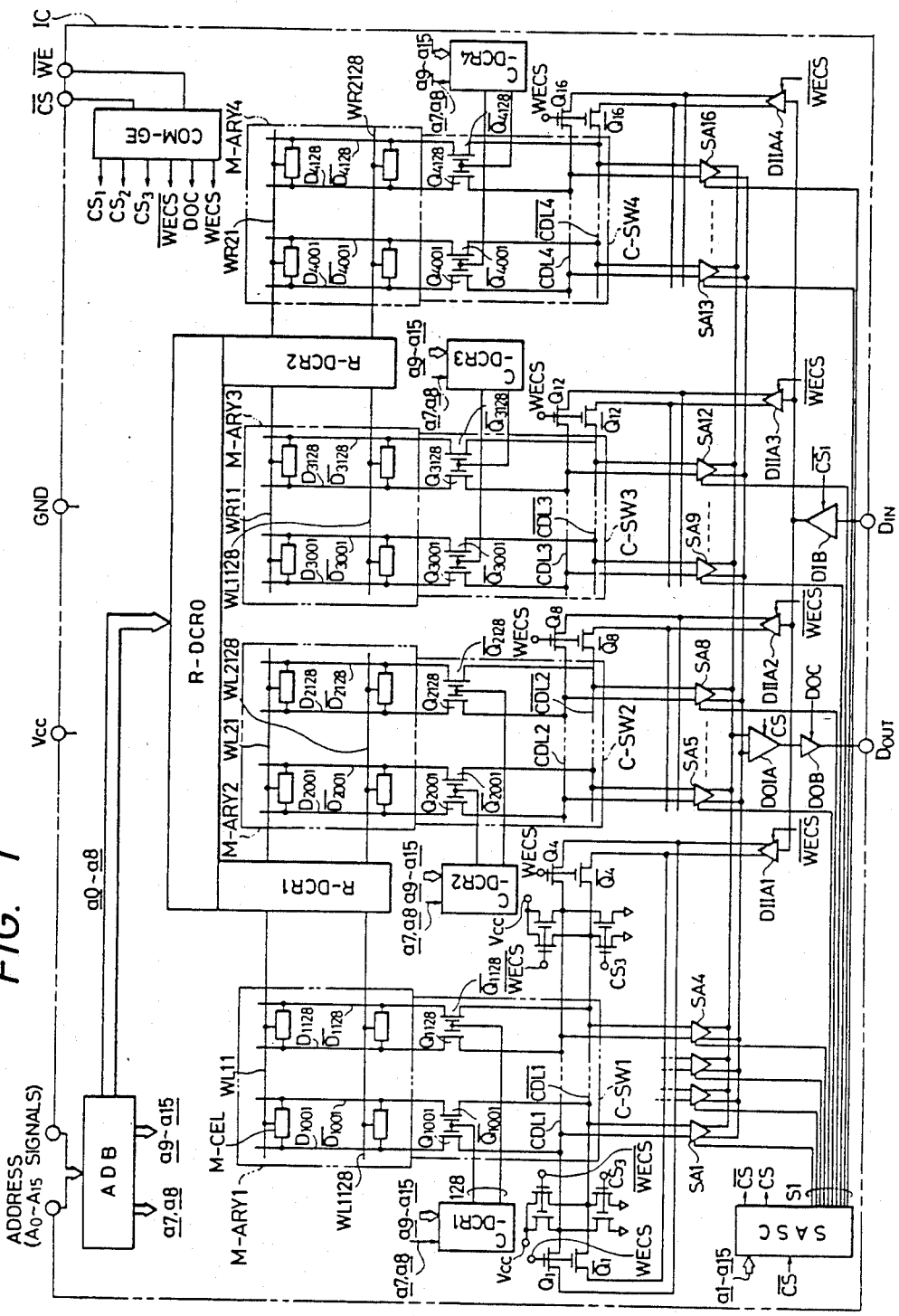
FIG. 1 is a block diagram showing the internal arrangement of a static RAM according to one embodiment of the present invention.

FIG. 1 shows the internal arrangement of a static RAM which has a storage capacity of 64 kbits and the input/output operation which is executed in single bit units. Various circuit blocks enclosed with a broken line IC are formed in a single silicon chip by semiconductor integrated circuit technology.

The static RAM of the present embodiment includes four matrices (memory arrays M-ARY1 to M-ARY4) each having a storage capacity of 16 kbits ($=16384$ bits), thereby to have a total storage capacity of 64 kbits (more specifically 65536 bits). The four memory arrays M-ARY1 to M-ARY4 have arrangements similar to each other, and each of them has memory cells arranged in 128 rows $\times$ 128 columns.

An address circuit for selecting a desired memory cell from the memory arrays each having the plurality of memory cells is constructed of an address buffer ADB, row decoders R-DCR0, R-DCR1 and R-DCR2, column decoders C-DCR1 to C-DCR4, column switches C-SW1 to C-SW4, etc.

Although not especially restricted, a signal circuit which handles the reading and writing of information is constructed of a data input buffer DIB, data input intermediate amplifier D-IIA1–DIIA4, a data output buffer DOB, a data output intermediate amplifier DOIA, and sense amplifiers SA1–SA16.

Although the invention is not especially restricted thereto, a timing circuit for controlling the operations of reading and writing information is constructed of an internal control signal generator circuit COM-GE and a sense amplifier selector circuit SASC.

A decode output signal which is obtained on the basis of address signals $A_0$–$A_8$ is transmitted from the row decoder R-DCR1 or R-DCR2 to any of row-group address selection lines (word lines WL11–WL1128, WL21–WL2128, WR11–WR1128 and WR21–WR2128). Among the address signals $A_0$–$A_8$, those $A_7$ and $A_8$ are used for selecting one memory matrix from among the four memory matrices M-ARY1 to M-ARY4.

The address buffer ADB receives the address signals $A_0$–$A_{15}$, and forms internal complementary address signals $a_0$–$a_{15}$ based on them. The internal complementary address signal $a_0$ is composed of an internal address signal $a_0$ which is inphase with the address signal $A_0$, and an internal address signal $\bar{a}_0$ whose phase is inverted to that of the address signal $A_0$. The remaining internal complementary address signals $a_1$–$a_{15}$ are similarly composed of internal address signals $a_1$–$a_{15}$ and internal address signals $\bar{a}_1$–$\bar{a}_{15}$.

Among the internal complementary address signals $a_0$–$\bar{a}_{15}$ formed by the address buffer ADB, those $a_7$, $a_8$ and $a_9$–$a_{15}$ are supplied to the column decoders C-DCR1 to C-DCR4. The column decoders C-DCR1 to C-DCR4 decode these internal complementary address signals, and supply selection signals (decode output signals) obtained by the decoding, to the gate electrodes of switching insulated-gate field effect transistors (hereinbelow termed "MISFETs") $Q_{1001}$, $\bar{Q}_{1001}$, $Q_{1128}$, $\bar{Q}_{1128}$, $Q_{2001}$, $\bar{Q}_{2001}$, $Q_{3001}$, $Q_{4001}$ and $\bar{Q}_{4001}$ within the column switches C-SW1 to C-SW4.

Among the word lines $WL_{11}$–$WL_{1128}$, $WL_{21}$–$WL_{2128}$, $WR_{11}$–$WR_{1128}$ and $WR_{21}$–$WR_{1128}$, one appointed by the combination of the external address signals $A_0$–$A_8$ is selected by the row decoders R-DCR1 and R-DCR2 described above. One complementary data line pair appointed by the combination of the external address signals $A_7$, $A_8$, and $A_9$–$A_{15}$ is selected from among a plurality of complementary data line pairs $D_{1001}$, $\bar{D}_{1001}$–$D_{1128}$, $\bar{D}_{1128}$; $D_{2001}$, $\bar{D}_{2001}$–$D_{2128}$, $\bar{D}_{2128}$; $D_{3001}$, $\bar{D}_{3001}$–$D_{3128}$, $\bar{D}_{3128}$; and $D_{4001}$, $\bar{D}_{4001}$–$D_{4128}$, $\bar{D}_{4128}$ by the column decoders C-DCR1 to C-DCR4 and the column switches C-SW1 to C-SW4 described above. Thus, the memory cell M-CEL which is located at the intersection point between the selected word line and the selected complementary data line pair is selected.

In the reading operation, switching MISFETs $Q_1$, $\bar{Q}_1$–$Q_4$, $\bar{Q}_4$, $Q_8$, $\bar{Q}_8$, $Q_{12}$, $\bar{Q}_{12}$, $Q_{16}$ and $\bar{Q}_{16}$ are brought into "off" states by a control signal which has been delivered from the internal control signal generator circuit COM-GE, though this is not especially restrictive. Thus, common data lines $CDL_1$, $\overline{CDL}_1$–$CDL_4$, $\overline{CDL}_4$ and write signal input intermediate amplifiers DIIA1–DIIA4 are electrically isolated. The information of the selected memory cell is transmitted to the common data lines through the selected complementary data line pair. The information of the memory cell transmitted to the common data lines is sensed by the sense amplifier, and is delivered out through the data output intermediate amplifier DOIA as well as the data output buffer DOB.

In the present embodiment, sixteen sense amplifiers are provided. Among these sense amplifiers SA1–SA16, one sense amplifier, i.e., the sense amplifier whose input terminals are coupled to the selected complementary data line pair through the common data lines, is selected by a sense amplifier selection signal from the sense amplifier selector circuit SASC, and it executes the sensing operation.

In the writing operation, the switching MISFETs $Q_1$, $\bar{Q}_1$–$Q_4$, $\bar{Q}_4$, $Q_8$, $\bar{Q}_8$, $Q_{12}$, $\bar{Q}_{12}$, $Q_{16}$ and $\bar{Q}_{16}$ are brought into "on" states by the control signal from the internal control signal generator circuit COM-GE. In a case where the column decoder C-DCR1, for example, has brought the switching MISFETs $Q_{1001}$ and $\bar{Q}_{1001}$ into "on" states in accordance with the address signals $A_7$–$A_{15}$, the output signal of the data input intermediate amplifier DIIA1 is transmitted to the complementary data line pair $D_{1001}$, $\bar{D}_{1001}$ through the common data line pair CDL1, $\overline{CDL1}$ and the MISFETs $Q_1$, $\bar{Q}_1$, $Q_{1001}$, $\bar{Q}_{1001}$. If, on this occasion, the word line WL11 is selected by the row decoder R-DCR1, information corresponding to the output signal of the data input intermediate amplifier DIIA1 is written into the memory cell which is disposed at the intersection point between the word line WL11 and the complementary data lines $D_{1001}$, $\bar{D}_{1001}$.

Although not especially restricted thereto, the common data line pair CDL1 and $\overline{CDL1}$ is composed of four sets of common data line pairs (subcommon data line pairs) in the present embodiment. Among these four sets of common data line pairs, two sets of common data line pairs are shown in the figure. Likewise, to the illustrated common data line pairs, the remaining two sets of common data line pairs are coupled to the data input intermediate amplifier DIIA1 through the switching MISFETs $Q_2$, $\bar{Q}_2$ and $Q_3$, $\bar{Q}_3$ respectively. The input terminals of one sense amplifier, and one input and output electrode of each of the 32 sets of switching MISFETs are coupled to each of the four sets of common data line pairs. That is, the input terminals of the sense amplifier SA1 and the input and output terminals of the switching MISFETs $Q_{1001}$, $\bar{Q}_{1001}$–$Q_{1032}$, $\bar{Q}_{1032}$ are coupled to the first common data line pair; the input terminals of the sense amplifier SA2 and the input and output terminals of the switching MISFETs $Q_{1033}$, $\bar{Q}_{1033}$–$Q_{1064}$, $\bar{Q}_{1064}$ are coupled to the second common data line pair; the input terminals of the sense amplifier SA3 and the input and output terminals of the switching MISFETs $Q_{1065}$, $\bar{Q}_{1065}$–$Q_{1096}$, $\bar{Q}_{1096}$ are coupled to the third common data line pair; and the input terminals of the sense amplifier SA4 and the input and output terminals of the switching MISFETs $Q_{1097}$, $\bar{Q}_{1097}$–$Q_{1128}$, $\bar{Q}_{1128}$ are coupled to the fourth common data line pair. In the writing operation, the four sets of common data line pairs are electrically coupled to each other through the switching MISFETs $Q_1$, $\bar{Q}_1$–$Q_4$, $\bar{Q}_4$, whereas in the reading operation, they are electrically isolated from each other. Thus, it is possible in the reading operation to reduce stray capacitances which are coupled to the input terminals of the sense amplifier, so that enhancement in the speed of the reading operation can be achieved. In the reading operation, only the sense amplifier having its input terminals coupled to the subcommon data line pair to which the information from the selected memory cell has been transmitted through the switching MISFETs is selected to execute the sensing operation. Each of the other common data line pairs CDL2, $\overline{CDL2}$–CDL4, $\overline{CDL4}$ has an arrangement similar to that of the common data line pair CDL, $\overline{CDL1}$ described above.

Although, in the present embodiment, the common control signal WECS is supplied to the switching MISFETs $Q_1$, $\bar{Q}_1$–$Q_4$, $\bar{Q}_4$, $Q_8$, $\bar{Q}_8$, $Q_{12}$, $\bar{Q}_{12}$, $Q_{16}$ and $\bar{Q}_{16}$, the selection signals from the column decoders may well be supplied to the respective switching MISFETs. Thus, it is possible in the writing operation to reduce the load capacitance of the data input intermediate amplifier, so that enhancement in the speed of the writing operation can be achieved.

The internal control signal generator circuit COM-GE receives two external control signals, $\overline{CS}$ (chip select signal) and $\overline{WE}$ (write enable signal), and generates a plurality of control signals $CS_1$, $CS_2$, $CS_3$, $\overline{WECS}$, WECS, DOC, etc.

The sense amplifier circuit SASC receives the chip select signal $\overline{CS}$ and the internal complementary address signals $a_7$–$\bar{a}_{15}$, and forms the foregoing sense amplifier selection signal and internal chip select signals CS, $\overline{CS}$.

Figure 2:
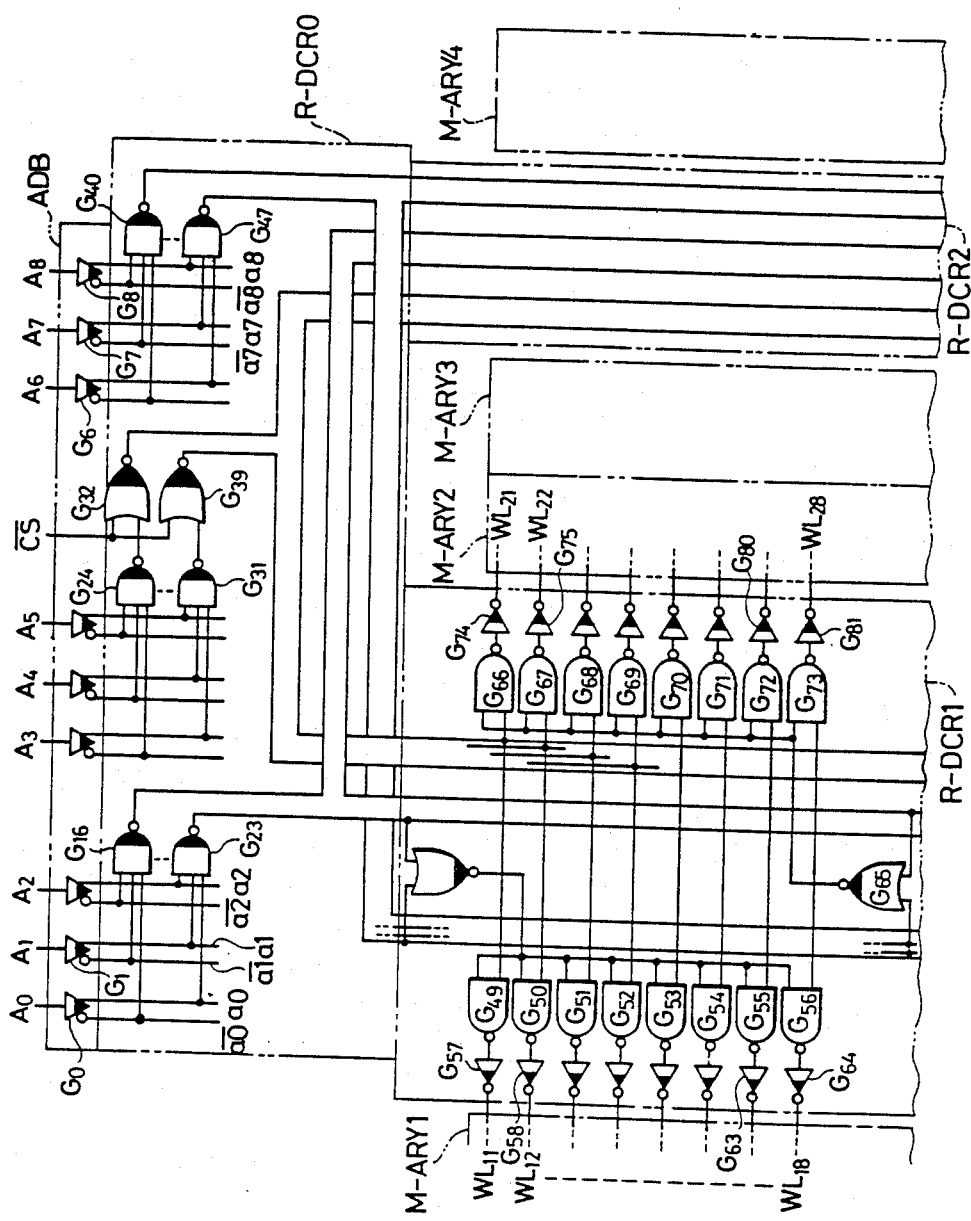
FIG. 2 is a block diagram showing an address buffer ADB and row decoders R-DCR0, R-DCR1, R-DCR2 in FIG. 1 in greater detail.

FIG. 2 is a block diagram which shows the address buffer ADB and row decoders R-DCR0, R-DCR1 and R-DCR2 in FIG. 2 in greater detail.

In FIG. 2, the circuits of those logic symbols whose output sides are marked black are quasi-CMOS circuits wherein an output transistor for charging and discharging an output signal line is made of a bipolar transistor, while transistors for logic processing such as inversion, non-inversion, NAND or NOR operations are made of CMOSFETs. The circuit of an ordinary logic symbol is a pure CMOS circuit.

As shown in FIG. 2, in the address buffer ADB, there are arranged non-inverting/inverting circuits $G_0$–$G_8$ whose inputs receive the address signals $A_0$–$A_8$ of TTL levels from outside and which serve to transmit the non-inverted outputs $a_0$–$a_8$ and the inverted outputs $\bar{a}_0$–$\bar{a}_8$ to complementary output signal lines.

Figure 4:
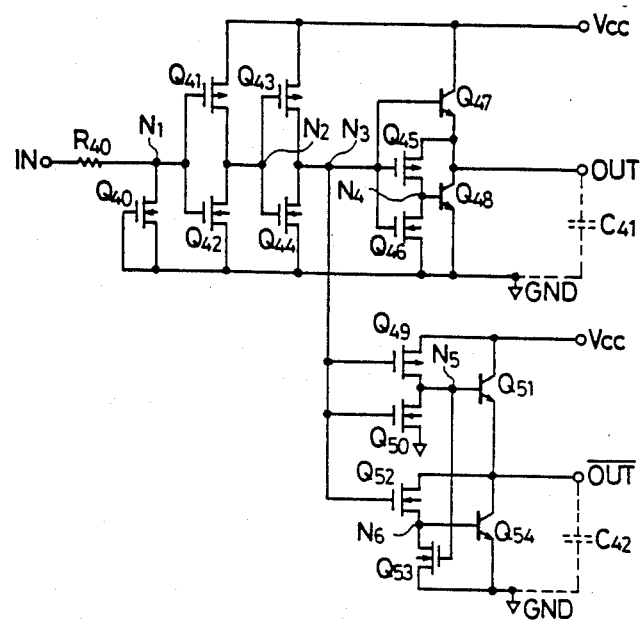
FIG. 4 is a circuit diagram showing a quasi-CMOS non-inverting/inverting circuit for use in the present invention.

Each of the non-inverting/inverting circuits $G_0$–$G_8$ is constructed of a quasi-CMOS circuit as shown in FIG. 4.

In FIG. 4, $Q_{40}$, $Q_{42}$, $Q_{44}$, $Q_{46}$, $Q_{50}$, $Q_{52}$ and $Q_{53}$ indicate N-channel MISFETs; $Q_{41}$, $Q_{43}$, $Q_{45}$ and $Q_{49}$ P-channel MISFETs; and $Q_{47}$, $Q_{48}$, $Q_{51}$ and $Q_{54}$ N-P-N bipolar transistors.

A resistor $R_{40}$ and the MISFET $Q_{40}$ constitute a gate protection circuit which serves to protect the gate insulator film of the MISFETs $Q_{41}$, $Q_{42}$ from an external surge voltage applied to an input terminal.

Since the MISFETs $Q_{41}$, $Q_{42}$, $Q_{43}$ and $Q_{44}$ constitute a CMOS inverter of two-stage cascade connection, a signal inphase with the signal of a node $N_1$ is transmitted to a node $N_3$.

Since also the MISFETs $Q_{45}$ and $Q_{46}$ constitute a CMOS inverter, a signal antiphase to the signal of the node $N_3$ is transmitted to a node $N_4$.

The transistor $Q_{47}$ is an output transistor for charging the capacitive load $C_{41}$ of an output terminal OUT, while the transistor $Q_{48}$ is an output transistor for discharging the capacitive load $C_{41}$.

Since also the MISFETs $Q_{49}$ and $Q_{50}$ constitute a CMOS inverter, a signal antiphase to the signal of the node $N_3$ is transmitted to a node $N_5$.

The MISFET $Q_{52}$ is a source-follower MISFET which is turned "on" by the signal of the node $N_3$ so as to apply a base current to the transistor $Q_{54}$ for discharging the capacitive load $C_{42}$ of an output terminal $\overline{\text{OUT}}$. The MISFET $Q_{53}$ operates, not only as the load of the source-follower MISFET $Q_{52}$, but also as a switching MISFET for discharging charges stored in the base of the transistor $Q_{54}$.

In order to prevent the transistor $Q_{48}$ from being driven in its saturation region, the source of the MISFET $Q_{45}$ is connected to the collector of the transistor $Q_{48}$, not to a power source $V_{CC}$. Likewise, in order to prevent the transistor $Q_{54}$ from being driven in its saturation region, the drain of the MISFET $Q_{52}$ is connected to the collector of the transistor $Q_{54}$, not to the power source $V_{CC}$. This point is also an important feature in improvements.

Accordingly, when a signal of high level is applied to the input terminal IN in the non-inverting/inverting circuit of FIG. 4, the node $N_3$ becomes the high level, and the nodes $N_4$ and $N_5$ become a low level, to supply a base current to the base of the transistor $Q_{47}$ through the transistor $Q_{43}$, so that the transistor $Q_{47}$ is turned "on". When the output terminal OUT is at the high level, the MISFET $Q_{52}$ is turned "on", so that the base current is supplied to the transistor $Q_{54}$ through this MISFET $Q_{52}$. At this time, the MISFETs $Q_{46}$ and $Q_{50}$ are "on" because the node $N_3$ is at the high level. In consequence, the transistors $Q_{45}$ and $Q_{54}$ turn "off" because charges stored in their bases are discharged through the MISFETs $Q_{46}$ and $Q_{50}$. Therefore, the capacitive load $C_{41}$ is charged rapidly by the bipolar output transistor $Q_{47}$ of low output impedance, while the capacitive load $C_{42}$ is discharged rapidly by the bipolar output transistor $Q_{54}$ of low output impedance. When the charge of the capacitive load $C_{41}$ has ended, current stops flowing through the collector-emitter path of the transistor $Q_{47}$. When the discharge of the capacitive load $C_{41}$ has ended, currents stop flowing through the drain-source path of the MISFET $Q_{52}$ and and the collector-emitter path of the bipolar transistor $Q_{54}$.

When a signal of low level is applied to the input terminal IN of the non-inverting/inverting circuit in FIG. 4, the transistors $Q_{47}$ and $Q_{54}$ turn "off" and those $Q_{48}$ and $Q_{51}$ turn "on", so that the capacitive load $C_{41}$ is discharged fast, while the capacitive load $C_{42}$ is charged fast. At this time, the MISFET $Q_{53}$ turns "on" because the node $N_5$ becomes the high level. In consequence, charges stored in the base of the bipolar transistor $Q_{54}$ are fast discharged to a ground potential point through the MISFET $Q_{53}$, so that the turn-off speed of the bipolar transistor $Q_{54}$ is enhanced. When the discharge of the capacitive load $C_{41}$ has ended, currents stop flowing through the drain-source path of the MISFET $Q_{45}$ and the collector-emitter path of the bipolar transistor $Q_{48}$. When the charge of the capacitive load $C_{42}$ has ended, current stops flowing through the collector-emitter path of the bipolar transistor $Q_{51}$.

If the charge and discharge of the capacitive loads $C_{41}$ and $C_{42}$ are not executed by the bipolar output transistors $Q_{47}$, $Q_{48}$, $Q_{51}$ and $Q_{54}$ but are instead executed by MISFETs, they will be executable only at low speed because the "on" resistance of the MISFET becomes a much larger value as compared with that of the bipolar transistor.

In contrast, in the address buffer of the embodiment in FIG. 2, the output transistors of the non-inverting/inverting circuits $G_0$–$G_8$ for delivering the internal address signals $a_0$, $\bar{a}_0$–$a_8$, $\bar{a}_8$ to the output signal lines thereof are made of the bipolar transistors as shown in FIG. 4, so that even when the output signal lines of the non-inverting/inverting circuits $G_0$–$G_8$ are arranged over relatively long distances on the surface of the semiconductor chip, the non-inverting/inverting circuits $G_0$–$G_8$ are permitted to operate at high speed.

The row decoder R-DCR0 in FIG. 2 operates as the pre-coder of the address circuit. This row decoder R-DCR0 is constructed of 3-input NAND circuits $G_{16}$–$G_{23}$, $G_{24}$–$G_{31}$ and $G_{40}$–$G_{47}$ to which the internal address signals $a_0$, $\bar{a}_0$–$a_8$, $\bar{a}_8$ obtained from the address buffer ADB are applied, and 2-input NOR circuits $G_{32}$–$G_{39}$ to which the chip select signal $\overline{CS}$ and the output signals of the 3-input NAND circuits $G_{24}$–$G_{31}$ are applied.

The output signal lines (that is, the output signal lines of the 3-input NAND circuits $G_{16}$–$G_{23}$ and $G_{40}$–$G_{47}$ and the output signal lines of the 2-input NOR circuits $G_{32}$–$G_{39}$) of the row decoder R-DCR0 as the pre-decoder are arranged over long distances in the vertical direction within the row decoders R-DCR1 and R-DCR2, which are the decoder drivers of the address circuit, as illustrated in FIG. 2.

Figure 5:
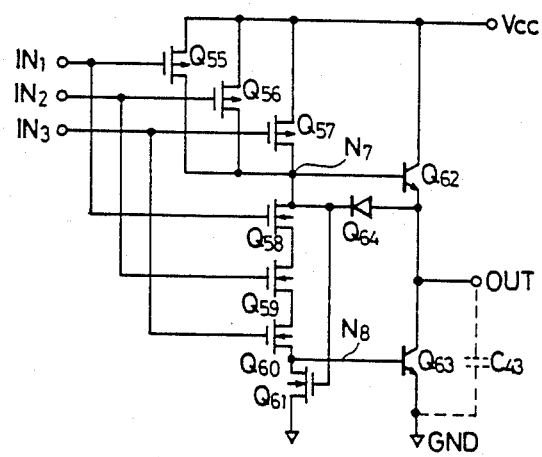
FIG. 5 is a circuit diagram showing a quasi-CMOS 3-input NAND circuit for use in the present invention.

Each of the 3-input NAND circuits $G_{16}$–$G_{23}$, $G_{24}$–$G_{31}$ and $G_{40}$–$G_{47}$ within the row decoder R-DCR0 in FIG. 2 is constructed of a quasi-CMOS circuit as shown in FIG. 5.

The quasi-CMOS 3-input NAND circuit in FIG. 5 includes an input logic processing portion which is composed of P-channel MISFETs $Q_{55}$–$Q_{57}$ and N-channel MISFETs $Q_{58}$–$Q_{61}$, and an output portion which is composed of N-P-N bipolar output transistors $Q_{62}$, $Q_{63}$. The MISFET $Q_{61}$ operates as a switching MISFET for discharging charges stored in the base of the bipolar transistor $Q_{63}$.

When input signals of high level are applied to all of three input terminals $IN_1$–$IN_3$, the transistors $Q_{55}$–$Q_{57}$ turn "off", the transistors $Q_{58}$–$Q_{60}$ turn "on", a node $N_7$ becomes a low level, and the transistor $Q_{61}$ turns "off". Then, in the output portion, the transistor $Q_{62}$ turns "off", and when an output terminal OUT is at the high level, the transistor $Q_{63}$ is supplied with a base current through the transistors $Q_{58}$–$Q_{60}$ and turns "on". Charges in the capacitive load $C_{43}$ of the output terminal OUT are rapidly discharged to a ground potential point through the collector-emitter path of the transistor $Q_{63}$, while at the same time, a discharge current flow through a route which extends along the capacitive load $C_{43}$, a diode $Q_{64}$, the MISFETs $Q_{58}$–$Q_{60}$ and the base-emitter junction of the bipolar transistor $Q_{63}$. A voltage drop across both the ends of the diode $Q_{64}$ at this time controls the transistor $Q_{62}$ into its "off" state reliably.

When an input signal of low level is applied to at least one of the three input terminals $IN_1$–$IN_3$, the node $N_7$ becomes the high level, the transistor $Q_{62}$ turns "on", and the capacitive load $C_{43}$ is rapidly charged through the collector-emitter path of the transistor $Q_{62}$. According to the high level of the node $N_7$, the transistor $Q_{61}$ turns "on", and the charges stored in the base of the transistor $Q_{63}$ are rapidly discharged through the drain-source path of the transistor $Q_{61}$, so that the turn-off speed of the transistor $Q_{63}$ can be enhanced.

In this manner, the output portion of the quasi-CMOS 3-input NAND circuit in FIG. 5 is constructed of the bipolar transistors $Q_{62}$ and $Q_{63}$, and hence, the charge and discharge of the capacitive load $C_{43}$ are executed at high speed.

Figure 6:
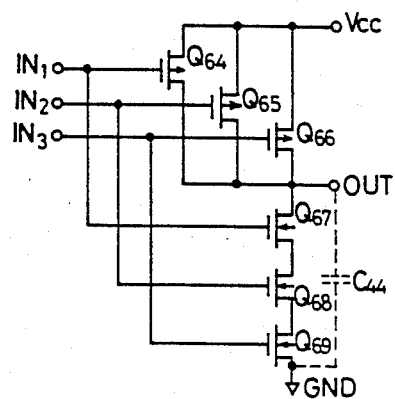
FIG. 6 is a circuit diagram showing a pure CMOS 3-input NAND circuit for use in the present invention.

Incidentally, since the 3-input NAND circuits $G_{24}$–$G_{31}$ within the row decoder R-DCR0 in FIG. 2 have their outputs connected to the inputs of the 2-input NOR circuits $G_{32}$–$G_{39}$ which is only a relatively short distance connection, each of them may well be constructed of a pure CMOS circuit as shown in FIG. 6.

The pure CMOS 3-input NAND circuit in FIG. 6 is composed of P-channel MISFETs $Q_{64}$–$Q_{66}$ and N-channel MISFETs $Q_{67}$–$Q_{69}$. Since the length of a signal line from an output terminal OUT is short as described above, the capacitance value of the stray capacitance $C_{44}$ of the output terminal OUT is small.

Accordingly, even when the charge and discharge of the small stray capacitance $C_{44}$ are executed by the MISFETs $Q_{64}$–$Q_{66}$ and $Q_{67}$–$Q_{69}$ having comparatively great "on" resistances, they can be executed at comparatively high speed.

Figure 7:
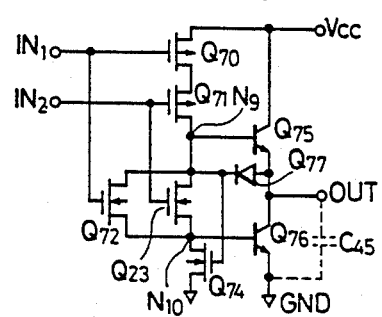
FIG. 7 is a circuit diagram showing a quasi-CMOS 2-input NOR circuit for use in the present invention.

Each of the 2-input NOR circuits $G_{32}$–$G_{39}$ within the row decoder R-DCR0 in FIG. 2 is constructed of a quasi-CMOS circuit as shown in FIG. 7.

The quasi-CMOS 2-input NOR circuit in FIG. 7 includes an input logic processing portion which is composed of P-channel MISFETs $Q_{70}$, $Q_{71}$ and N-channel MISFETs $Q_{72}$–$Q_{74}$, and an output portion which is composed of N-P-N bipolar output transistors $Q_{75}$, $Q_{76}$. The MISFET $Q_{74}$ operates as a switching MISFET which serves to discharge charges stored in the base of the bipolar transistor $Q_{76}$.

When input signals of low level are applied to both of two input terminals $IN_1$ and $IN_2$, the transistors $Q_{70}$ and $Q_{71}$ turn "on", the transistors $Q_{72}$ and $Q_{73}$ turn "off", and a node $N_9$ becomes a high level. Then, the transistor $Q_{75}$ turns "on", and the capacitive load $C_{45}$ of an output terminal OUT is rapidly charged through the collector-emitter path of the transistor $Q_{75}$. The high level of the node $N_9$ turns "on" the transistor $Q_{74}$, and the charges stored in the base of the transistor $Q_{76}$ are rapidly discharged through the drain-source path of the transistor $Q_{74}$, so that the turn-off speed of the transistor $Q_{76}$ can be enhanced.

When an input signal of high level is applied to at least either of the two input terminals, for example, the input terminal $IN_1$, the transistor $Q_{70}$ turns "off", the transistor $Q_{72}$ turns "on", and the node $N_9$ becomes the low level. Then, in the output portion, the transistor $Q_{75}$ turns "off", and when the output terminal OUT is at the high level, the transistor $Q_{76}$ is supplied with a base current through the transistors $Q_{72}$, $Q_{77}$ and turns "off". Charges in the capacitive load $C_{45}$ of the output terminal OUT are rapidly discharged through the collector-emitter path of the transistor $Q_{76}$, while at the same time, a discharge current flows through a route which extends along the capacitive load $C_{45}$, a diode $Q_{77}$, the drain-source path of the MISFET $Q_{72}$ and the base-emitter junction of the bipolar transistor $Q_{76}$. Owing to a voltage drop across both the ends of the diode $Q_{77}$ at this time, the bipolar transistor $Q_{75}$ is reliably controlled into its "off" state.

The row decoders R-DCR1 and R-DCR2 in FIG. 2 operate as the decoder drivers of the address circuit. The row decoder R-DCR1 includes a 2-input NOR circuit $G_{48}$ which receives the output signals of the row decoder R-DCR0, 2-input NAND circuits $G_{49}$–$G_{56}$ which receive the output signal of the 2-input NOR circuit $G_{48}$ and the output signals of the row decoder R-DCR0, and inverters $G_{57}$–$G_{64}$ which receive the output signals of the 2-input NAND circuits $G_{49}$–$G_{56}$.

The distances of the signal lines between the output of the 2-input NOR circuit $G_{48}$ and the inputs of the 2-input NAND circuits $G_{49}$–$G_{56}$ are relatively long, and the stray capacitance values of these signal lines are large. Accordingly, the 2-input NOR circuit $G_{48}$ is constructed of the quasi-CMOS circuit as shown in FIG. 7.

Figure 9:
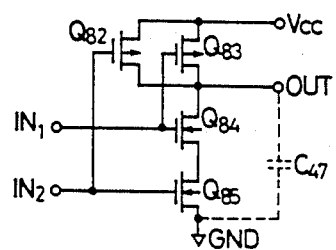
FIG. 9 is a circuit diagram showing a pure CMOS 2-input NAND circuit for use in the present invention.

Since the 2-input NAND circuits $G_{49}$–$G_{56}$ within the row decoder R-DCR1 in FIG. 2 have their outputs connected to the inputs of the inverters $G_{57}$–$G_{64}$ which is only a relatively short distance connection, each of them is constructed of a pure CMOS circuit as shown in FIG. 9.

The pure CMOS 2-input NAND circuit in FIG. 9 is composed of P-channel MISFETs $Q_{82}$, $Q_{83}$ and N-channel MISFETs $Q_{84}$, $Q_{85}$. Since the length of the signal line from an output terminal OUT is short as described above, the capacitance value of the stray capacitance of the output terminal OUT is small.

Accordingly, even when the charge and discharge of the small stray capacitance $C_{47}$ are executed by the MISFETs $Q_{82}$, $Q_{83}$, $Q_{84}$ and $Q_{85}$ having comparatively great "on" resistances, they are executed at high speed.

The outputs of the inverters $G_{57}$–$G_{64}$ within the row decoder R-DCR1 in FIG. 2 are connected to the word lines $WL_{11}$–$WL_{18}$ of the memory array M-ARY1. Accordingly, the output signal lines (that is, the output signal lines of the inverters $G_{57}$–$G_{64}$) of the row decoder R-DCR1 as the decoder driver are arranged to cover relatively long distances in the lateral direction inside the memory array M-ARY1 as the word lines $WL_{11}$–$WL_{18}$, so that the stray capacitances of the word lines $WL_{11}$–$WL_{18}$ become quite large.

Figure 10:
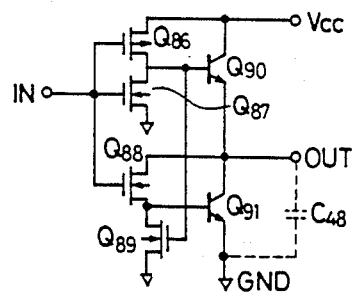
FIG. 10 is a circuit diagram showing a quasi-CMOS inverter for use in the present invention.

Thus, each of the inverters $G_{57}$–$G_{64}$ within the row decoder R-DCR1 in FIG. 2 is constructed of a quasi-CMOS circuit as shown in FIG. 10.

The quasi-CMOS inverter in FIG. 10 is composed of a P-channel MISFET $Q_{86}$, N-channel MISFETs $Q_{87}$–$Q_{89}$, and N-P-N bipolar output transistors $Q_{90}$, $Q_{91}$. The operation of this quasi-CMOS inverter is the same as the operation of the circuit $Q_{49}$–$Q_{54}$ for obtaining the inverted output $\overline{OUT}$ of the non-inverting/inverting circuit in FIG. 4, and the detailed description shall therefore be omitted. The charge and discharge of a great stray capacitance $C_{48}$ are executed at high speed by the N-P-N bipolar output transistors $Q_{90}$, $Q_{91}$.

In FIG. 2, the row decoder D-DCR2 is constructed similarly to the R-DCR1 stated above.

Figure 3:
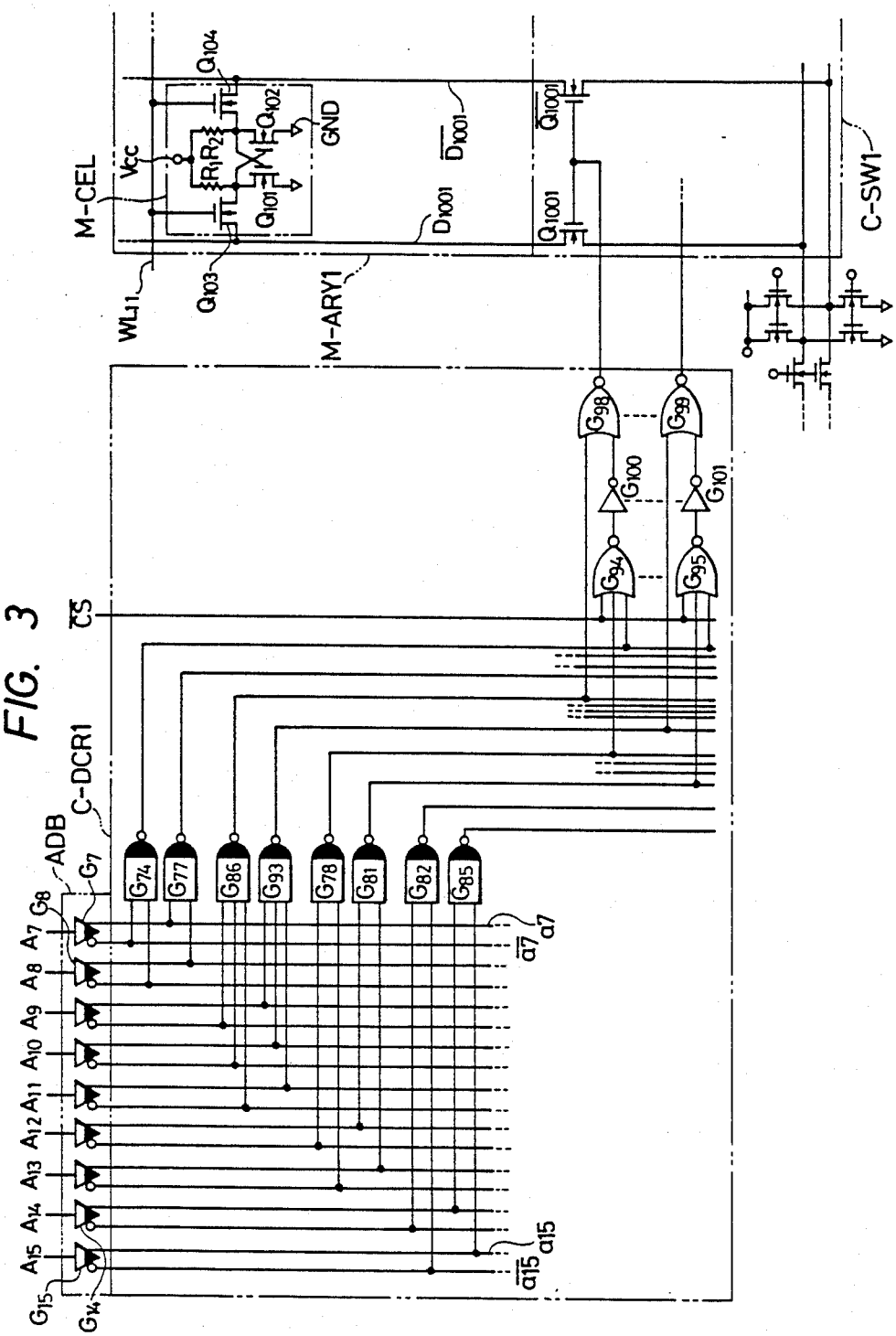
FIG. 3 is a block diagram showing the address buffer ADB, a column decoder C-DCR1, etc.

FIG. 3 is a block diagram which shows the address buffer ADB, the column decoder C-DCR1, etc. in FIG. 1 in greater detail.

Also in FIG. 3, the circuits of those logic symbols whose output sides are marked black are quasi-CMOS circuits wherein an output transistor for charging and discharging the stray capacitance of an output signal line is made of a bipolar transistor and wherein logic processing such as inversion, non-inversion, NAND or NOR is executed by a CMOS circuit. The circuit of an ordinary logic symbol is a pure CMOS circuit.

As shown in FIG. 3, in the address buffer ADB, there are arranged non-inverting/inverting circuits $G_7$–$G_{15}$ whose inputs receive the address signals $A_7$–$A_{15}$ of TTL levels from outside and which serve to transmit the non-inverted outputs $a_7$–$a_{15}$ and the inverted outputs $\bar{a}_7$–$\bar{a}_{15}$ to their complementary output signal lines.

Each of the non-inverting/inverting circuits $G_7$–$G_{15}$ is constructed of the quasi-CMOS circuit as shown in FIG. 4. Accordingly, the output transistors of each of the non-inverting/inverting circuits $G_7$–$G_{15}$ are made of the bipolar transistors as illustrated in FIG. 4, so that even when the output signal lines of the non-inverting-/inverting circuits $G_7$–$G_{15}$ are arranged to extend relatively long distances on the surface of the semiconductor chip, the non-inverting/inverting circuits $G_7$–$G_{15}$ are permitted to operate at high speed.

The column decoder C-DCR1 includes 2-input NAND circuits $G_{74}$–$G_{77}$, $G_{78}$–$G_{81}$ and $G_{82}$–$G_{85}$ to which the internal address signals $a_7$–$a_{15}$ and $\bar{a}_7$–$\bar{a}_{15}$ obtained from the address buffer ADB are applied, and 3-input NAND circuits $G_{86}$–$G_{93}$.

Further, as shown in FIG. 3, the output signal lines of the NAND circuits $G_{74}$–$G_{93}$ are arranged with long distances and are connected to the input terminals of a large number of NOR circuits $G_{94}$–$G_{95}$ inside the column decoder C-DCR1, so that the stray capacitances of the output signal lines of the NAND circuits $G_{74}$–$G_{93}$ become large capacitance values.

Accordingly, each of the 3-input NAND circuits $G_{86}$–$G_{93}$ is constructed of the quasi-CMOS 3-input NAND circuit as shown in FIG. 5, and each of the 2-input NAND circuits $G_{74}$–$G_{85}$ is constructed of a quasi-CMOS 2-input NAND circuit which is obtained by omitting the input terminal $IN_3$ and the MISFETs $Q_{57}$, $Q_{60}$ from FIG. 5.

On the other hand, in FIG. 2, the output signal lines of the 3-input NOR circuits $G_{94}$, $G_{95}$ are connected to the inputs of inverters $G_{100}$, $G_{101}$ with short distances, so that the stray capacitances of the output signal lines of the 3-input NOR circuits $G_{94}$–$G_{95}$ have small capacitance values. Accordingly, each of the 3-input NOR circuits $G_{94}$–$G_{95}$ is constructed of a pure CMOS 3-input NOR circuit.

Further, the output signal lines of the inverters $G_{100}$, $G_{101}$ are connected to the input terminals of 2-input NOR circuits $G_{98}$, $G_{99}$ with a relatively short distance connection so that the stray capacitances of the output signal lines of the inverters $G_{100}$, $G_{101}$ have small capacitance values. Accordingly, each of the inverters $G_{100}$, $G_{101}$ is constructed of a well-known pure CMOS inverter.

Further, the output signal lines of the 2-input NOR circuits $G_{98}$, $G_{99}$ are connected to the gate electrodes of the switching MISFETs $Q_{1001}$, $\overline{Q}_{1001}$ of the column switch C-SW$_1$ with comparatively short distance connections, so that the stray capacitances of the output signal lines of the NOR circuits $G_{98}$, $G_{99}$ are small. Accordingly, each of these NOR circuits is constructed of a pure CMOS 2-input NOR circuit as shown in FIG. 8.

Figure 8:
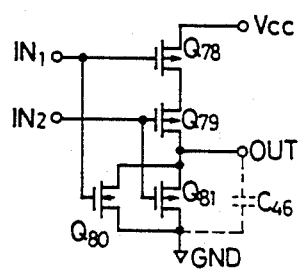
FIG. 8 is a circuit diagram showing a pure CMOS 2-input NOR circuit for use in the present invention.

The pure CMOS 2-input NOR circuit in FIG. 8 is composed of P-channel MISFETs $Q_{78}$, $Q_{79}$ and N-channel MISFETs $Q_{80}$, $Q_{81}$. Since the distance of the signal line from an output terminal is comparatively short, the stray capacitance $C_{46}$ of the output terminal OUT has a small capacitance value.

Accordingly, even when the charge and discharge of the small stray capacitance $C_{46}$ are executed by the MISFETs $Q_{78}$, $Q_{79}$ $Q_{80}$ and $Q_{81}$ having comparatively great "on" resistances, they are executed at high speed.

Each of the aforementioned 3-input NOR circuits $G_{94}$–$G_{95}$ is constructed of a pure CMOS 3-input circuit wherein a third input terminal $IN_3$ is added to the 2-input NOR circuit in FIG. 8, a third P-channel MISFET whose gate is connected to a third input terminal $IN_3$ is inserted in series with the MISFETs $Q_{78}$ and $Q_{79}$, and a third N-channel MISFET whose gate is connected to the input terminal $IN_3$ is inserted in parallel with the MISFETs $Q_{80}$, $Q_{81}$.

In addition to the above, it can be seen that, in FIG. 3, the 1-bit memory cell M-CEL of the memory array M-ARY1 in FIG. 1 is shown in greater detail. Specifically, the memory cell M-CEL is shown as being composed of a flip-flop in which the inputs and outputs of a pair of inverters consisting of load resistances $R_1$, $R_2$ and N-channel MISFETs $Q_{101}$, $Q_{102}$ are cross-connected, and N-channel MISFETs $Q_{103}$, $Q_{104}$ which serve as transmission gates.

The flip-flop is employed as a means for storing information. The transmission gates are controlled by the address signal which is applied to the word line $WL_{11}$ connected to the row decoder R-DCR1, and the information transmission between the complementary data line pair $D_{1001}$, $\overline{D}_{1001}$ and the flip-flop is controlled by the transmission gates.

Figure 11:
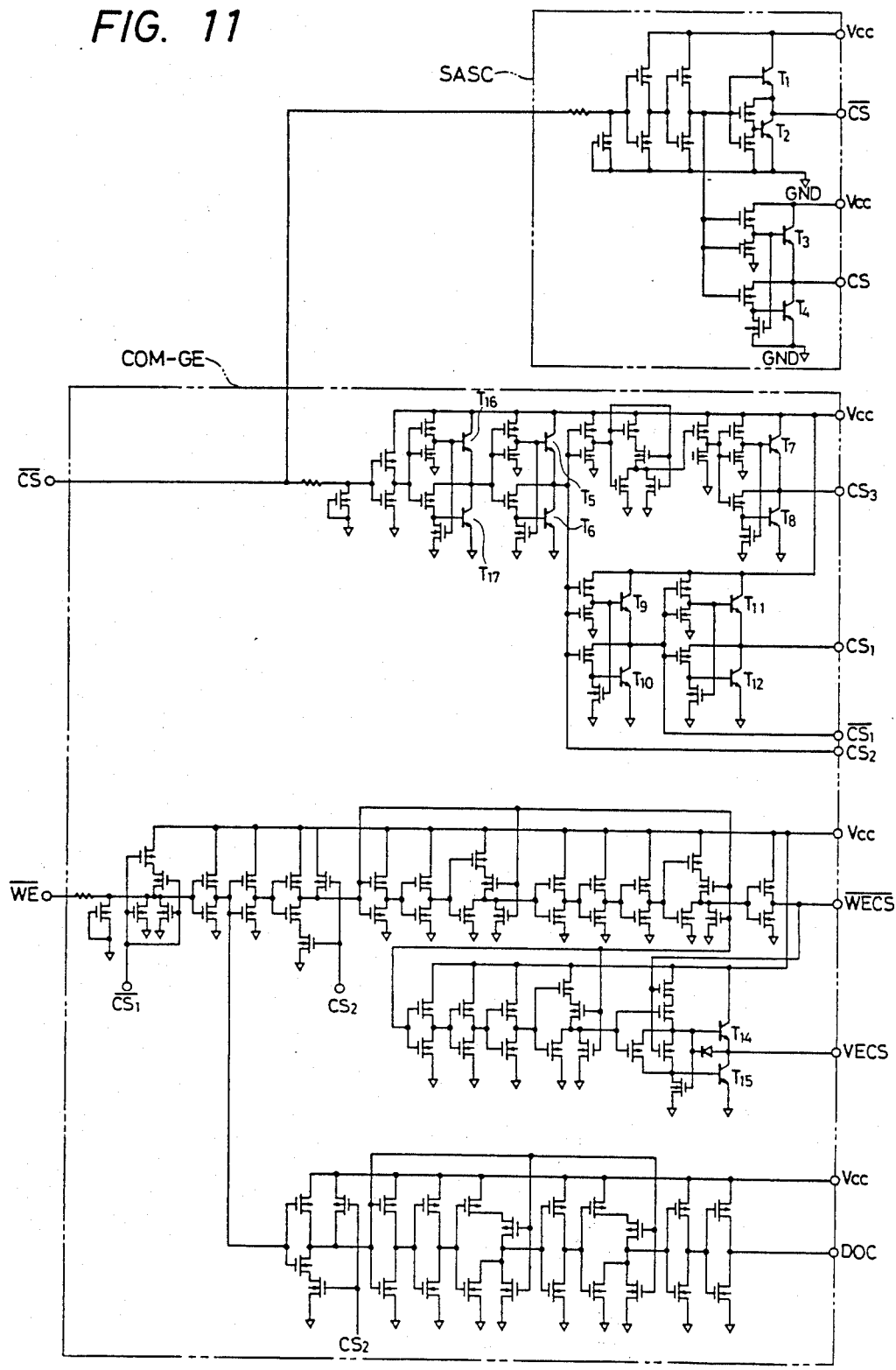
FIG. 11 is a circuit diagram showing a sense amplifier selector circuit SASC and an internal control signal generator circuit COM-GE in FIG. 1 in greater detail.

FIG. 11 is a circuit diagram in which one example of the essential portions of the sense amplifier selector circuit SASC and one example of the internal control signal generator circuit COM-GE in FIG. 1 are shown more in detail.

Shown in the figure is the circuit of that part of the sense amplifier selector circuit SASC which receives the external chip select signal $\overline{CS}$ and which forms the control signals CS, $\overline{CS}$ to be supplied to the data output intermediate amplifier DOIA, the row decoder R-DCR0 and the column decoder C-DCR1.

The circuit of this portion to which the external chip select signal $\overline{CS}$ is applied is constructed of the same circuit as the non-inverting/inverting circuit in FIG. 4. Since the output signal CS of this circuit is obtained from bipolar output transistors $T_1$, $T_2$, $T_3$ and $T_4$, the capacitance dependences of the charging and discharging speeds of the outputs $\overline{CS}$, CS of the sense amplifier selector circuit SASC are low. Accordingly, even when the output $\overline{CS}$ of the sense amplifier selector circuit SASC is connected to the input terminals of the NOR gates $G_{32}$–$G_{39}$ of the row decoder R-DCR0 in FIG. 2 and to the input terminals of the NOR gates $G_{94}$–$G_{95}$ of the column decoder C-DCR1 in FIG. 3, this output $\overline{CS}$ becomes fast. Besides, even when the output CS of the sense amplifier selector circuit SASC is connected to the gate electrodes of a plurality of switching MISFETs within the data output intermediate amplifier DOIA, this output CS becomes fast.

Although no illustration is made in the figure, the sense amplifier selector circuit SASC includes a decoder circuit which receives the internal complementary address signals $a_7$–$a_{15}$ and the aforementioned control signal CS and which forms a selection signal S1 to be supplied to the sense amplifier. Among the sense amplifiers SA1–SA16, the sense amplifier whose input terminals are electrically coupled to the complementary data line pair to be selected is selected by this decoder circuit, whereupon the sensing operation thereof is executed. The output portion of this decoder circuit is constructed of a quasi-CMOS circuit so as to lower the capacitance dependences of the charge and discharge of the output. Thus, the speed of the operation of selecting the sense amplifier can be enhanced. Even in a case where the above control signal is supplied to the decoder circuit, the control signal CS is fast because it is formed by the bipolar transistors as stated above.

Although, in the present embodiment, the decoder circuit is disposed in the sense amplifier selector circuit SASC in order to select the sense amplifiers, the selection signals formed by the column decoders C-DCR1 to C-DCR4 may well be utilized for the selection signals of the sense amplifiers. This measure can reduce the number of elements, and therefore permits enhancing the density of integration.

The internal control signal generator circuit COM-GE in FIG. 11 includes a circuit portion which is supplied with the external chip select signal $\overline{CS}$, thereby to generate a plurality of internal delay chip select signals $CS_2$, $\overline{CS_1}$, $CS_1$ and $CS_3$. The greater part of this circuit portion is constructed of CMOS circuits. Since, however, the outputs $CS_2$, $\overline{CS_1}$, $CS_1$ and $CS_3$ are respectively obtained from bipolar output transistors $T_5$, $T_6$; $T_9$, $T_{10}$; $T_{11}$, $T_{12}$; and $T_7$, $T_8$, the capacitance dependences of the charge and discharge of these outputs are low.

The internal control signal generator circuit COM-GE in FIG. 11 is further provided with a circuit portion which is supplied with the external write enable signal $\overline{WE}$ and the internal delay chip select signals $\overline{CS_1}$, $CS_2$, thereby to generate the write control signals $\overline{WECS}$, WECS and a data output buffer control signal DOC. The greater part of this circuit portion is similarly constructed of CMOS circuits. Since, however, the signal WECS is obtained from bipolar output transistors $T_{14}$, $T_{15}$, the capacitance dependences of the charge and discharge of this output WECS are low. Accordingly, even when the output WECS is applied to the large number of input terminals of the NAND circuits (not shown) of the column decoder C-DCR1 in FIG. 3 or the gate electrodes of the switching MISFETs $Q_1$, $\overline{Q_1}$–$Q_{16}$, $\overline{Q_{16}}$ in FIG. 1, this output WECS becomes fast.

Figure 12:
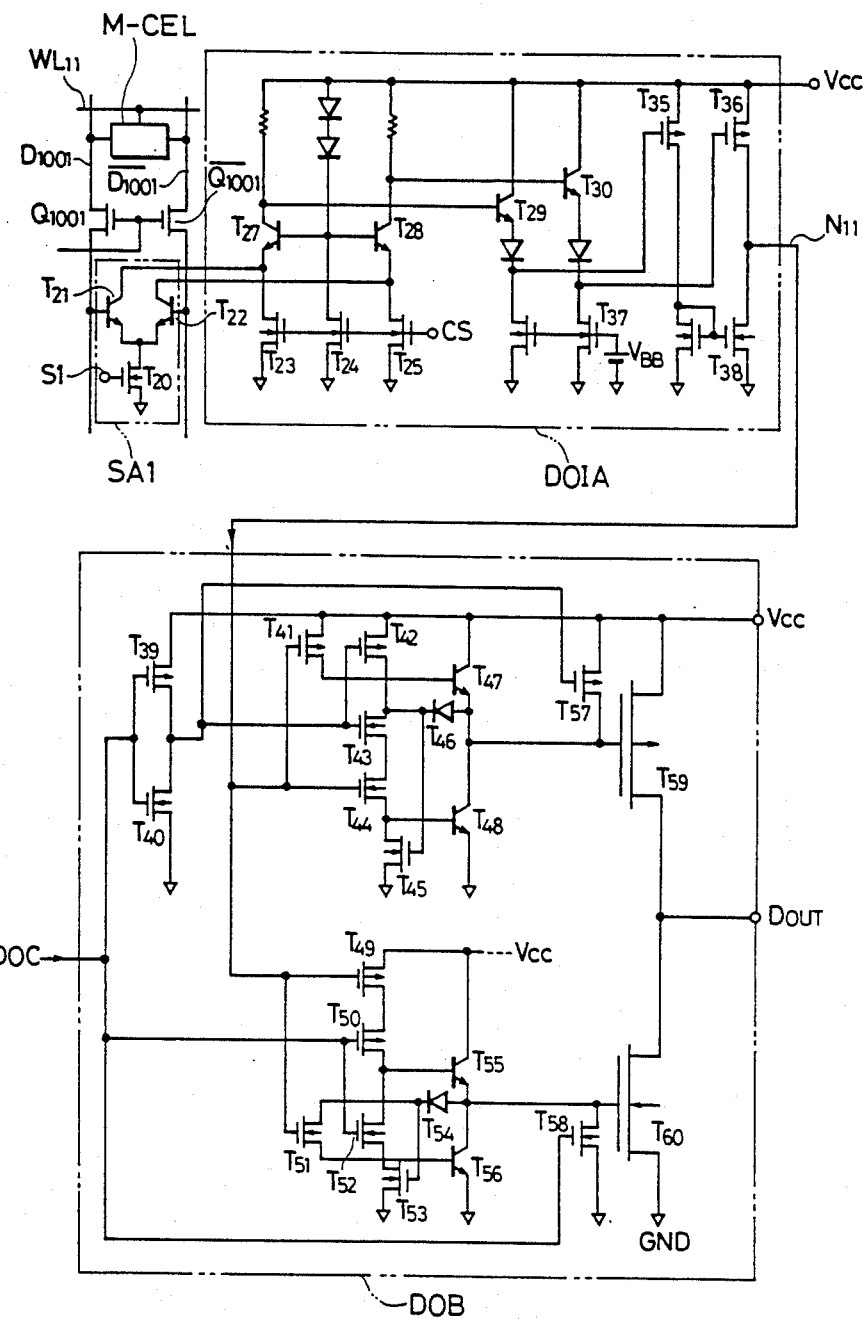
FIG. 12 is a circuit diagram showing a sense amplifier SA1, a data output intermediate amplifier DOIA, a data output buffer DOB, etc.

FIG. 12 is a circuit diagram in which the sense amplifier SA1, the data output intermediate amplifier DOIA, the data output buffer DOB, etc, in FIG. 1 are shown more in detail.

Figure 13:
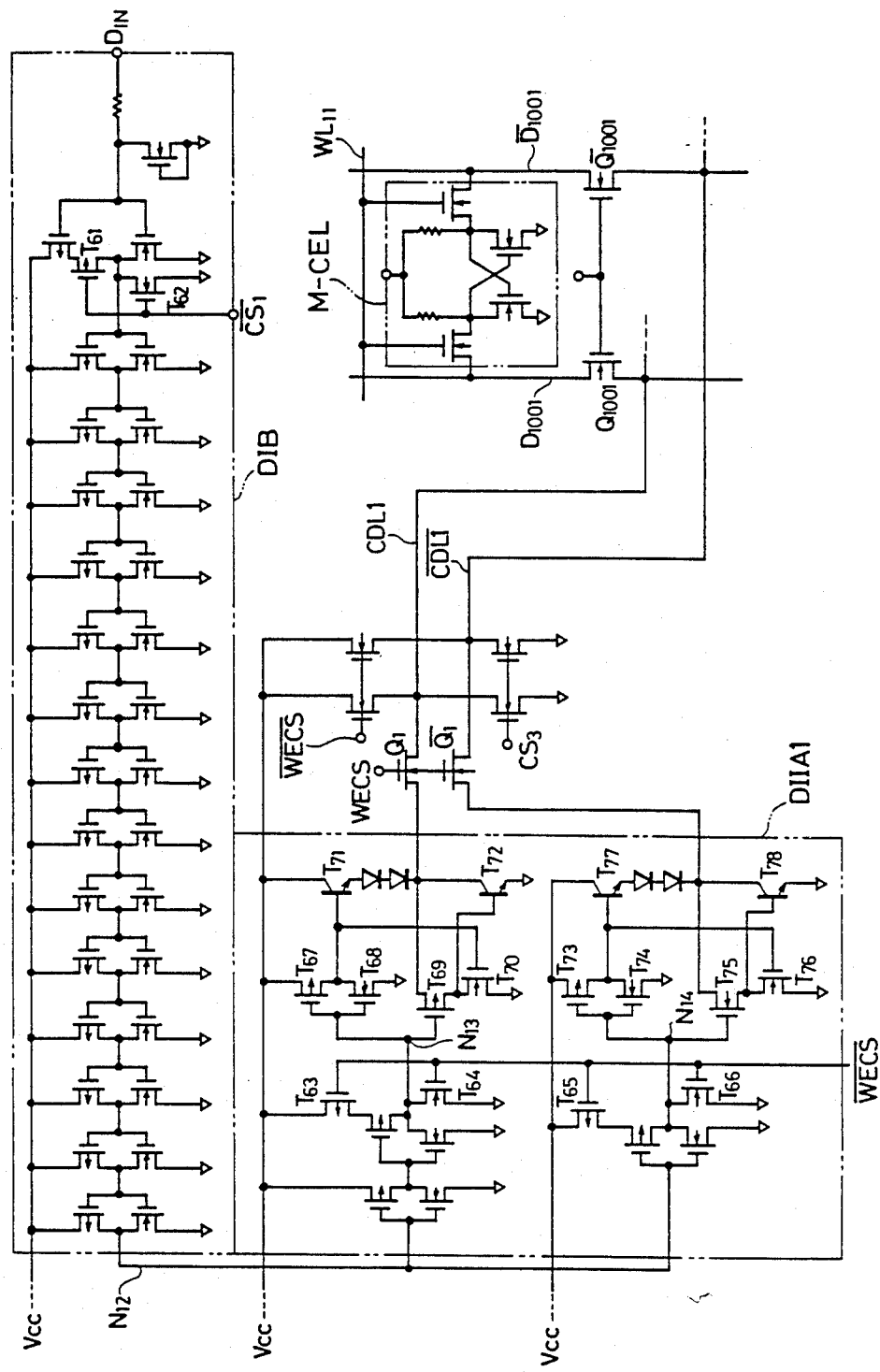
FIG. 13 is a circuit diagram showing a data input buffer DIB, a data input intermediate amplifier DIIA1, etc.

FIG. 13 is a circuit diagram in which the data input buffer DIB, the data input intermediate amplifier DIIA1, etc. in FIG. 1 are shown more in detail.

Figure 14:
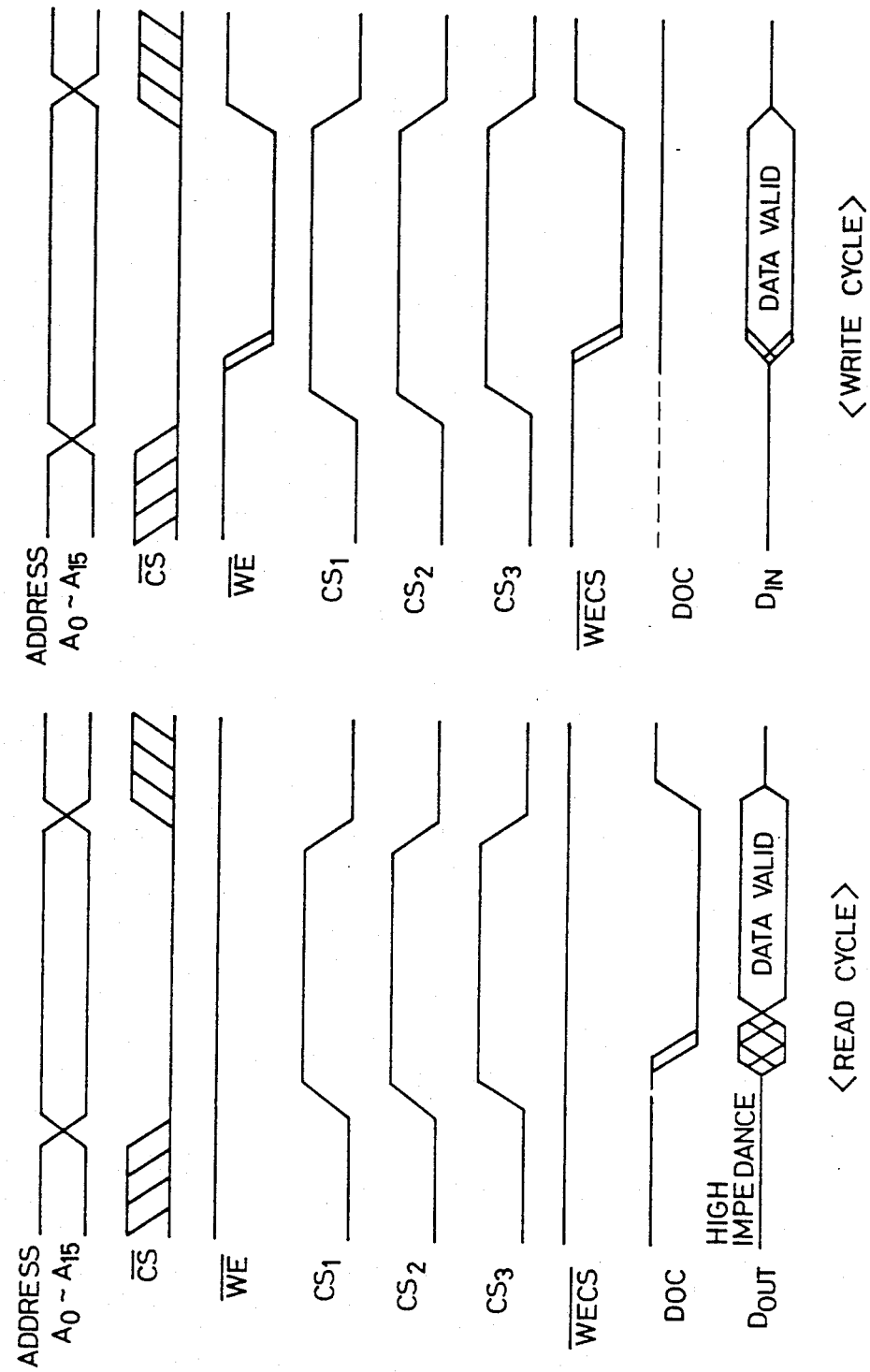
FIG. 14 is a diagram of the signal waveforms of the various parts of the static RAM of the embodiment shown in FIGS. 1 to 13, in a read cycle and a write cycle.

FIG. 14 is a diagram of the signal waveforms of various parts in the read cycle and write cycle of the static RAM which is one embodiment shown in FIGS. 1 to 13.

First, the operation of the static RAM in the cycle of reading information will be described with reference to FIGS. 12 and 14.

It is assumed that, as illustrated in FIG. 14, simultaneously with the application of the address signals $A_0$–$A_{15}$, the chip select signal $\overline{CS}$ is changed to the low level, whereas the write enable signal $\overline{WE}$ is held at the high level as it is. As shown in FIG. 14, the internal delay chip select signals $CS_1$, $CS_2$, $CS_3$, the write control signal $\overline{WECS}$ and the data output buffer control signal DOC are produced from the internal control signal generator circuit COM-GE at that time.

In a case where the supplied address signals $A_0$–$A_{15}$ are, for example, those which appoint the word line $WL_{11}$ and the complementary data line pair $D_{1001}$, $\overline{D}_{1001}$, the memory cell M-CEL which is disposed at the intersection point between the word line $WL_{11}$ and the complementary data line pair $D_{1001}$, $\overline{D}_{1001}$ is selected. The internal information of the selected memory cell M-CEL is transmitted to both the inputs of the sense amplifier SA1 through the complementary data line pair $D_{1001}$, $\overline{D}_{1001}$ and the switching MISFETs $Q_{1001}$, $\overline{Q}_{1001}$. The sense amplifier SA1 is composed of a differential pair of emitter-coupled transistors $T_{21}$, $T_{22}$ and a constant current source MISFET $T_{20}$. When the selection signal S1 of high level is applied from the sense amplifier selector circuit SASC to the gate electrode of the constant current source MISFET $T_{20}$, the sense amplifier SA1 executes the sensing operation.

When the internal chip select signal CS of high level is applied from the sense amplifier selector circuit SASC to the gate electrodes of constant current source MISFETs $T_{23}$–$T_{26}$ of the data output intermediate amplifier DOIA, this data output intermediate amplifier executes the amplifying operation.

Accordingly, the output signal of the sense amplifier SA1 is transmitted to the output node $N_{11}$ of the data output intermediate amplifier DOIA through grounded-base transistors $T_{27}$, $T_{28}$, emitter-follower transistors $T_{29}$, $T_{30}$ and output MISFETs $T_{35}$–$T_{38}$.

As illustrated in FIG. 12, the data output buffer DOB is supplied with the data output buffer control signal DOC from the internal control signal generator circuit COM-GE. In addition, as shown in FIG. 12, the data output buffer DOB is composed of a pure CMOS inverter of $T_{39}$ and $T_{40}$, a quasi-CMOS 2-input NAND circuit of $T_{41}$–$T_{48}$, a quasi-CMOS 2-input NOR circuit of $T_{49}$–$T_{56}$, a P-channel switching MISFET $T_{57}$, an N-channel switching MISFET $T_{58}$, a P-channel output MISFET $T_{59}$, and an N-channel output MISFET $T_{60}$.

When the data output buffer control signal DOC is at the high level, the switching MISFETs $T_{57}$, $T_{58}$ are turned "on", and the output MISFETs $T_{59}$, $T_{60}$ are simultaneously turned "off", so that the output $D_{out}$ of the data output buffer DOB falls into a high impedance state (floating state).

In the cycle of reading information, the data output buffer control signal DOC becomes the low level to turn "off" the switching MISFETs $T_{57}$, $T_{58}$, and the gate electrodes of the output MISFETs $T_{59}$, $T_{60}$ are controlled by the output of the quasi-CMOS 2-input NAND circuit and the output of the quasi-CMOS 2-input NOR circuit, the outputs being responsive to the signal level of the output node $N_{11}$ of the data output intermediate amplifier DOIA, whereby valid data is obtained from the output terminal $D_{out}$.

In order to reduce the "on" resistances of the output MISFETs $T_{59}$, $T_{60}$, the channel widths W of these MISFETs are set at very large values. Then, the gate capacitances of these MISFETs $T_{59}$, $T_{60}$ become very large. Since, however, the output portion of the quasi-CMOS 2-input NAND circuit is composed of the bipolar output transistors $T_{47}$, $T_{48}$ and the output portion of the quasi-CMOS 2-input NOR circuit is composed of the bipolar output transistors $T_{55}$, $T_{56}$, the charge and discharge of the gate capacitances of the output MISFETs $T_{59}$, $T_{60}$ are executed at high speed.

Referring now to FIGS. 13 and 14, the operation of the static RAM in the cycle of writing information will be described.

As illustrated in FIG. 14, simultaneously with the application of the address signals $A_0$-$A_{15}$, the chip select signal $\overline{CS}$ changes to the low level, whereupon the write enable signal $\overline{WE}$ changes to the low level. As shown in FIG. 14, the internal delay chip select signals $CS_1$, $CS_2$, $CS_3$, the write control signal $\overline{WECS}$ and the data output buffer control signal DOC are produced from the internal control signal generator circuit COM-GE at that time.

As shown in FIG. 13, input data $D_{in}$ and the inverted internal chip select signal $\overline{CS}_1$ are applied to the data input buffer DIB. In writing information, the signal $\overline{CS}_1$ changes to the low level. Then, a P-channel switching MISFET $T_{61}$ of the data input buffer changes into the "on" state, and an N-channel switching MISFET $T_{62}$ into the "off" state. Thus, the input data $D_{in}$ is transmitted to an output node $N_{12}$ through pure CMOS inverters in multi-stage connection.

In writing information, the write control signal $\overline{WECS}$ changes to the low level. Then, within the data input intermediate amplifier DIIA1 in FIG. 13, P-channel MISFETs $T_{63}$, $T_{65}$ turn "on", and N-channel MISFETs $T_{64}$, $T_{66}$ turn "off", so that a signal inphase with the signal of the output node $N_{12}$ of the data input buffer DIB appears at a node $N_{13}$, while a signal antiphase thereto appears at a node $N_{14}$.

The signal of the node $N_{13}$ is transmitted to the common data line $CDL_1$ through a quasi-CMOS inverter composed of transistors $T_{67}$-$T_{72}$, while the signal of the node $N_{14}$ is transmitted to the common data line $\overline{CDL}_1$ through a quasi-CMOS inverter composed of transistors $T_{73}$-$T_{78}$. Since the charge and discharge of the common data line pair $CDL_1$, $\overline{CDL}_1$ of great parasitic capacitances are executed by the bipolar output transistors $T_{71}$, $T_{72}$ and $T_{77}$, $T_{78}$ of these quasi-CMOS inverters, they are executed at high speed.

Thus, the complementary output signals of the data input intermediate amplifier DIIA1 are transmitted to the memory cell M-CEL through the common data line pair $CDL_1$, $\overline{CDL}_1$, the switching MISFETs $Q_1$, $\overline{Q}_1$, $Q_{1001}$, $\overline{Q}_{1001}$, and the complementary data line pair $D_{1001}$, $\overline{D}_{1001}$, whereby the writing of the information into the memory cell is executed.

As a result of the structure described in the foregoing description, the following advantages are achieved:

(1) Each of the non-inverting/inverting circuits $G_0$-$G_{15}$ of an address buffer ADB is constructed of a quasi-CMOS circuit. Since, in the quasi-CMOS circuit, the greater part of a logic processing portion of non-inversion/inversion is constructed of CMOS circuits, a low power consumption is possible. Further, output transistors which execute the charge and discharge of non-inverted and inverted outputs are made of bipolar transistors, so that even when the stray capacitances of the output signal lines of the non-inverting/inverting circuits $G_0$-$G_{15}$ become large, a high speed operation is obtained since the bipolar transistors can afford a lower output resistance with smaller element dimensions than a MISFET.

(2) Circuits whose output signal lines have large stray capacitances, such as the NAND circuits $G_{16}$-$G_{23}$, $G_{24}$-$G_{31}$, $G_{40}$-$G_{47}$, the NOR circuits $G_{32}$-$G_{39}$, $G_{48}$-$G_{65}$ and the inverters $G_{57}$-$G_{64}$ of row decoders R-DCR0, R-DCR1, R-DCR2 are constructed of quasi-CMOS circuits, so that these circuits will be low in the power consumption and high in operating speed.

Further, circuits whose output signal lines have small stray capacitances, such as NAND circuits $G_{49}$-$G_{56}$, are constructed of pure CMOS circuits, so that these circuits can be low in the power consumption.

(3) Circuits whose output signal lines have large stray capacitances, such as the NAND circuits $G_{74}$-$G_{93}$ of column decoders C-DCR1 to C-DCR4, are constructed of quasi-CMOS circuits, so that these circuits will be low in the power consumption and high in operating speed.

Further, circuits whose output signal lines have small stray capacitances, such as NOR circuits $G_{94}$-$G_{99}$ and inverters $G_{100}$, $G_{101}$, are constructed of pure CMOS circuits, so that these circuits will be low in the power consumption.

(4) Since a non-inverting/inverting circuit constituting a sense amplifier selector circuit SASC is constructed of a quasi-CMOS circuit, a low power consumption is achieved. Also, since outputs CS, $\overline{CS}$ are obtained from bipolar output transistors, these outputs CS, $\overline{CS}$ become fast even when their stray capacitances are large.

(5) Since an internal control signal generator circuit COM-GE is constructed of a quasi-CMOS circuit, a low power consumption is achieved, and since outputs $CS_2$, $CS_3$, $\overline{CS}_1$, $CS_1$, WECS are obtained from bipolar output transistors, these outputs $CS_2$, $CS_3$, $\overline{CS}_1$, $CS_1$, WECS become fast even when their stray capacitances are large.

(6) Since a data output buffer DOB is constructed of a quasi-CMOS circuit, a low power consumption is achieved.

Further, since the large gate capacitances of the output MISFETs of the data output buffer DOB are charged and discharged by bipolar output transistors, the charge and discharge of the gate capacitances are executed at high speed.

(7) Since a data input buffer DIB is constructed of a pure CMOS circuit, a low power consumption is achieved.

(8) Since a data input intermediate amplifier DIIA1 is constructed of a quasi-CMOS circuit, a low power consumption is achieved.

Further, since the charge and discharge of common data line pair CDL$_1$, $\overline{CDL}_1$, which have large parasitic capacitances, are executed by bipolar output transistors, they are executed at high speed.

Owing to the synergistic effect of the above, the following characteristics could be obtained in the static SRAM described in the foregoing embodiment:

(a) The propagation delay time $t_{pd}$ from the input to the output of each of the non-inverting/inverting circuits G$_0$–G$_{15}$ of the address buffer ADB was shortened to about 3.0 (nsec). The stand-by power consumption of all the non-inverting/inverting circuits G$_0$–G$_{15}$ was reduced to about 33.7 (mW), and the operating power consumption to about 45.8 (mW).

(b) The propagation delay time $t_{pd}$ from the input to the output of each of the row decoders R-DCR0, R-DCR1, R-DCR2 and the column decoders C-DCR1 to C-DCR4 was reduced to about 4.8 (nsec). The stand-by power consumption of all the decoders was reduced to substantially zero, and the operating power consumption to about 153 (mW).

(c) The propagation delay time $t_{pd}$ of all of a memory cell M-CEL, a sense amplifier SA1 and a data output intermediate amplifier DOIA was reduced to about 5.0 (nsec). The stand-by power consumption of all memory cells M-CEL numbering 64 k (65536), all sense amplifiers SA1–SA16, and the data output intermediate amplifier DOIA was reduced to about 0.6 (mW), and the operating power consumption to about 160 (mW).

(d) The propagation delay time $t_{pd}$ from the input to the output of the data output buffer DOB was shortened to 2.8 (nsec). The stand-by power consumption was reduced to substantially zero, and the operating power consumption to 23.5 (mW).

(e) Owing to the above (a)–(d), the access time (read time) was shortened to about 15.6 (nsec). This value is substantially equal to the 15 (nsec) access time of presently known ECL type bipolar RAMs.

(f) Owing to the above (a)–(d), the stand-by power consumption of the static SRAM of the present embodiment was reduced to about 34.3 (mW), and the operating power consumption to about 382.3 (mW). These values represent relatively low power consumption characteristics intermediate between those of a prior-art bipolar RAM and a prior-art static MOSRAM (and actually closer to those of the prior-art static MOSRAM).

Although, in the above, the invention made by the inventors has been concretely described on the basis of a preferred embodiment, it is needless to say that the present invention is not restricted to the foregoing embodiment. On the contrary, it can be variously modified within a scope not departing from the subject matter thereof.

For example, in the memory cell M-CEL in FIG. 3, the load resistances R$_1$, R$_2$ may well be replaced with P-channel MISFETs so as to construct the flip-flop out of CMOS inverters. Besides, the flip-flop may well be constructed of multi-emitter N-P-N transistors.

Further, by performing refresh, the memory cell M-CEL may well be constructed of an information latch circuit based on the storage of charges in a cell capacitance, not of the flip-flop circuit.

The signal levels of the address signals A$_0$–A$_{15}$ which are applied to the address buffer ADB may well be set to be ECL levels, rather than TTL levels, with the address buffer ADB executing a proper level conversion operation.

An input D$_{in}$ or output D$_{out}$ may well be constructed in the form of a plurality of bits (for example, 4 bits, 8 bits, ...), not 1 bit.

Also, of course, the number of the memory matrices is not restricted to four, but it may well be larger or smaller.

Further, although specific values have been given for various parameters or characteristics, it is to be understood that these are illustrative only, and do not serve to limit the present invention.

Finally, while, in the above, the invention made by the inventors has been chiefly described as to the case of application to the semiconductor memory, it is not restricted thereto.

For example, it is needless to say that, not only memory cells, address circuits for selecting a specified cell, signal circuits for handling the reading and writing of information, and the timing circuits for controlling the operations of reading and writing information can utilize the present invention. On the contrary, a variery of other circuits such as bipolar analog circuits, MOS analog circuits, P-channel MOS logic, N-channel MOS logic, CMOS logic, I$^2$L circuits and ECL circuits can be arranged on the semiconductor chip as may be needed to incorporate the principles of the present invention.

We claim:

1. A semiconductor integrated circuit comprising:
  a plurality of storage means for storing information therein;
  an address circuit for selecting a specified storage means from among said plurality of storage means;
  a signal circuit coupled to said storage means and including means for respectively reading and writing information from and into said storage means; and
  a timing circuit coupled to said signal circuit for controlling operations of reading and writing information,
  wherein said signal circuit includes a data output buffer for obtaining an information output signal, said data output buffer including a principal portion constructed of a CMOS circuit, and a plurality of bipolar transistors, which execute charge and discharge of gate capacitances of N-channel and P-channel output MISFETs of said data output buffer.

2. A semiconductor integrated circuit as defined in claim 1, wherein both said output MISFETs are controlled into a simultaneous "off" state by a data output buffer control signal.

3. A semiconductor integrated circuit comprising:
  a plurality of storage means for storing information therein;
  an address circuit for selecting a specified storage means from among said plurality of storage means;
  a signal circuit coupled to said storage means and including means for respectively reading and writing information from and into said storage means; and
  a timing circuit coupled to said signal circuit for controlling operations of reading and writing information,
  wherein said signal circuit includes a data input amplifier which supplies complementary signals to a common data line pair, said data input amplifier including a principal portion constructed of a CMOS circuit and at least one bipolar transistor, which executes at least one of charge and discharge of one of said common data line pair.

4. A semiconductor integrated circuit as defined in claim 3, wherein input data is transmitted to an input terminal of said data input amplifier through a data input buffer which is constructed of said CMOS circuit.

5. A semiconductor integrated circuit comprising:
an input node;
an output node;
first and second power supply terminals for supplying first and second power supply levels, respectively, to said semiconductor circuit;
a first bipolar transistor having an emitter-collector path coupled between said first power supply terminal and said output node;
a second bipolar transistor having an emitter-collector path coupled between said second power supply terminal and said output node;
a first MOS transistor having a gate coupled to said input node;
a second MOS transistor of opposite conductivity type to said first MOS transistor having a gate coupled to said input node,
wherein said first and second MOS transistors are coupled in series with one another to have their respective source-drain paths coupled in series between said output node and said second power supply terminal to form a CMOS inverter circuit, and wherein a base of said second bipolar transistor is coupled to a junction between the respective source-drain paths of said first and second MOS transistors, and further wherein a base of said first bipolar transistor is coupled to said input node;
a CMOS circuit having an input coupled to said input node and having first and second outputs coupled, respectively, to bases of said first and second bipolar transistors, wherein said CMOS circuit includes means for driving said first and second bipolar transistors in a push-pull mode of operation; and
a discharge MOS transistor coupled to have a source-drain path coupled between a base of said second bipolar transistor and said second power supply terminal, said discharge MOS transistor also having a gate coupled to said first output of said CMOS circuit so that discharge of the base capacitance of said second bipolar transistor is controlled by said first output of said CMOS circuit which is coupled to the base of said first bipolar transistor,
wherein said CMOS circuit includes a first MOS transistor of a first conductivity type having a gate coupled to said input node and having a source-drain path coupled between said first power supply terminal and said first CMOS circuit output, a second MOS transistor of a second conductivity type having a gate coupled to said input node and having a source-drain path coupled between said second power supply terminal and said first CMOS circuit output, and a third MOS transistor of said second conductivity type having a gate coupled to said input node and having a source-drain path coupled between said output node and the second CMOS circuit output.

6. A semiconductor integrated circuit according to claim 5, wherein said first bipolar transistor is coupled to have a collector coupled to said first power supply terminal and an emitter coupled to said output node, and said second bipolar transistor is coupled to have a collector coupled to said second output node and an emitter coupled to said second power supply terminal.

7. A semiconductor integrated circuit device according to claim 5, further comprising diode means coupled between said emitter collector path of said first bipolar transistor and said output node.

8. A semiconductor integrated circuit device comprising:
an input node;
an output node;
first and second power supply terminals for supplying first and second power supply levels, respectively, to said semiconductor circuit;
a first bipolar transistor having an emitter-collector path coupled between said first power supply terminal and said output node;
a second bipolar transistor having an emitter-collector path coupled between said second power supply terminal and said output node;
a CMOS circuit having an input coupled to said input node and having first and second outputs coupled, respectively, to bases of said first and second bipolar transistors, wherein said CMOS circuit includes means for driving said first and second bipolar transistors in a push-pull mode of operation; and
a discharge MOS transistor coupled to have a source-drain path coupled between a base of said second bipolar transistor and said second power supply terminal, said discharge MOS transistor also having a gate coupled to said first output of said CMOS circuit so that discharge of the base capacitance of said second bipolar transistor is controlled by said first output of said CMOS circuit which is coupled to the base of said first bipolar transistor, and
wherein said first bipolar transistor is coupled to have a collector coupled to said first power supply terminal and an emitter coupled to said output node, and said second bipolar transistor is coupled to have a collector coupled to said output node and an emitter coupled to said second power supply terminal,
further comprising diode means coupled between said emitter-collector path of said first bipolar transistor and said output node.

9. A semiconductor integrated circuit device according to claim 8, wherein said CMOS circuit includes a first MOS transistor of a first conductivity type having a gate coupled to said input node and having a source-drain path coupled between said first power supply terminal and said first CMOS circuit output, a second MOS transistor of a second conductivity type having a gate coupled to said input node and having a source-drain path coupled between said second power supply terminal and said first CMOS circuit output, and a third MOS transistor of said second conductivity type having a gate coupled to said input node and having a source-drain path coupled between said output node and the second CMOS circuit output.

10. A semiconductor integrated circuit device according to claim 9, wherein said discharge MOS transistor is of said second conductivity type.

11. A semiconductor integrated circuit device according to claim 10, wherein said first conductivity type is a P-channel type, and wherein said second conductivity type is an N-channel type.

12. A semiconductor integrated circuit device according to claim 11, wherein said first and second bipolar transistors are NPN bipolar transistors.

13. A semiconductor integrated circuit comprising:
a plurality of storage means for storing information therein;
an address circuit for selecting a specified storage means from among said plurality of storage means;
a signal circuit coupled to said storage means and including means for reading information from said storage means; and
a timing circuit coupled to said signal circuit for controlling operations of reading information,
wherein said address circuit includes a principal portion constructed of a CMOS circuit, and at least one bipolar output transistor, which executes at least one of charge and discharge of a signal output line of at least one circuit in said address circuit,
and further wherein said reading means in said signal circuit includes differential bipolar transistors coupled to receive an output signal of said specified storage means.

14. A semiconductor integrated circuit as defined in claim 13, wherein said address circuit further includes an address buffer to which address signals are applied, and wherein said bipolar output transistor comprises a bipolar output transistor of said address buffer which executes at least one of charge and discharge of a signal output line of said address buffer.

15. A semiconductor integrated circuit as defined in claim 13, wherein said address circuit includes a row decoder which executes charge and discharge of word lines of the storage means, and wherein a plurality of said output bipolar transistors are provided to execute at least one of charge and discharge of said word lines.

16. A semiconductor integrated circuit according to claim 13, wherein said siganl circuit further includes means for writing information into said storage means, and wherein said timing circuit further includes means for controlling operations of writing information by said writing means.

17. A semiconductor integrated circuit as defined in claim 16, wherein said address circuit includes an address buffer to which address signals are applied, and wherein said bipolar output transistor comprises a bipolar output transistor of said address buffer which executes at least one of charge and discharge of a signal output line of said address buffer.

18. A semiconductor integrated circuit as defined in claim 16, wherein said address circuit includes a row decoder which executes charge and discharge of word lines of the storage means, and wherein a plurality of said output bipolar transistors are provided to execute at least one of charge and discharge of said word lines.

19. A semiconductor integrated circuit according to claim 13, wherein said address circuit further includes a second bipolar output transistor which executes the other of charge and discharge of said signal output line of said at least one circuit in said address circuit.

20. A semiconductor integrated circuit as defined in claim 19, wherein said address circuit further includes an address buffer to which address signals are applied, and wherein said bipolar output transistors comprise bipolar output transistors of said address buffer which execute charge and discharge of a signal output line of said address buffer.

21. A semiconductor integrated circuit as defined in claim 19, wherein said address circuit includes a row decoder which executes charge and discharge of word lines of the storage means, and wherein a plurality of said output bipolar transistors are provided to execute charge and discharge of said word lines.

22. A semiconductor integrated circuit comprising:
a plurality of storage means for storing information therein;
an address circuit for selecting a specified storage means from among said plurality of storage means;
a signal circuit coupled to said storage means and including means for reading information from said storage means; and
a timing circuit coupled to said signal circuit for controlling operations of reading information,
wherein said timing circuit includes a principal portion constructed of a CMOS circuit, and at least one bipolar output transistor, which executes at least one of charge and discharge of a signal output line of at least one circuit in said timing circuit,
and further wherein said reading means in said signal circuit includes differential bipolar transistors coupled to receive an output signal of said specified storage means.

23. A semiconductor integrated circuit as defined in claim 22, wherein said timing circuit includes an internal control signal generator circuit which is supplied with a chip select signal and a write enable signal, thereby to generate an internal delayed chip select signal and a write control signal.

24. A semiconductor integrated circuit according to claim 22, wherein said signal circuit further includes means for writing information into said storage means, and wherein said timing circuit further includes means for controlling operations of writing information by said writing means.

25. A semiconductor integrated circuit as defined in claim 24, wherein said timing circuit includes an internal control signal generator circuit which is supplied with a chip select signal and a write enable signal, thereby to generate an internal delayed chip select signal and a write control signal.

26. A semiconductor integrated circuit according to claim 22, wherein said timing circuit further includes a second bipolar output transistor which executes the other of charge and discharge of said signal output line of said at least one circuit in said timing circuit.

27. A semiconductor integrated circuit as defined in claim 26, wherein said timing circuit includes an internal control signal generator circuit which is supplied with a chip select signal and a write enable signal, thereby to generate an internal delayed chip select signal and a write control signal.

28. A semiconductor integrated circuit comprising:
a plurality of storage means for storing information therein;
an address circuit for selecting a specified storage means from among said plurality of storage means;
a signal circuit coupled to said storage means and including means for reading information from said storage means; and
a timing circuit coupled to said signal circuit for controlling operations of reading information,
wherein said signal circuit includes a data output buffer for obtaining an information output signal at an external output terminal, said data output buffer including a principal portion constructed of a CMOS circuit, and at least one bipolar transistor, which executes at least one of charge and discharge of a gate capacitance of an output MISFET of said data output buffer, said output MISFET having a source-drain path coupled to said external output terminal.

29. A semiconductor integrated circuit as defined in claim 28, wherein said output MISFET is controlled into an "off" state by a data output buffer control signal.

30. A semiconductor integrated circuit comprising:
a plurality of storage means for storing information therein;
an address circuit for selecting a specified storage means from among said plurality of storage means;
a signal circuit coupled to said storage means and including means for reading information from said storage means; and
a timing circuit coupled to said signal circuit for controlling operations of reading information,
wherein said signal circuit includes a data output buffer for obtaining an information output signal at an external output terminal, said data output buffer including a principal portion constructed of a CMOS circuit, and a plurality of bipolar transistors, which execute charge and discharge of a gate capacitance of an output MISFET of said data output buffer, said output MISFET having a source-drain path coupled to said external output terminal.

31. A semiconductor integrated circuit as defined in claim 30, wherein said output MISFET is controlled into an "off" state by a data output buffer control signal.

32. A semiconductor integrated circuit comprising:
a plurality of memory cells;
an address circuit for selecting a specified memory cell from among said plurality of memory cells;
a signal circuit coupled to said memory cells and including means for reading information from said memory cells; and
a timing circuit coupled to said signal circuit for controlling operations of reading information,
wherein said address circuit includes a principal portion constructed of a CMOS circuit, and at least one bipolar output transistor, which executes at least one of charge and discharge of a signal output line of at least one circuit in said address circuit, and
wherein said address circuit further includes an address buffer to which address signals are applied, and wherein said bipolar output transistor comprises a bipolar output transistor of said address buffer which executes at least one of charge and discharge of a signal output line of said address buffer.

33. A semiconductor integrated circuit according to claim 32, wherein said address buffer further includes a second bipolar output transistor which executes the other of charge and discharge of said signal output line of said address buffer.

34. A semiconductor integrated circuit according to claim 33, wherein said signal circuit further includes means for writing information into said memory cells, and wherein said timing circuit further includes means for controlling operations of writing information by said writing means.

35. A semiconductor integrated circuit comprising:
a plurality of memory cells;
an address circuit for selecting a specified memory cell from among said plurality of memory cells;
a signal circuit coupled to said memory cells and including means for reading information from said memory cells; and
a timing circuit coupled to said signal circuit for controlling operations of reading information,
wherein said address circuit includes a row decoder which executes charge and discharge of word lines of the memory cells, and
wherein said row decoder includes a principal portion constructed of a CMOS circuit, and at least one bipolar output transistor, which executes at least one of charge and discharge of at least one of said word lines.

36. A semiconductor integrated circuit according to claim 35, wherein said row decoder further includes a second bipolar output transistor which executes the other of charge and discharge of said at least one of said word lines.

37. A semiconductor integrated circuit comprising:
a plurality of memory cells;
an address circuit for selecting a specified memory cells from among said plurality of memory cells;
a signal circuit coupled to said memory cells and including means for reading information from said memory cells; and
a timing circuit coupled to said signal circuit for controlling operations of reading information,
wherein said timing circuit includes an internal control signal generator circuit which is supplied with a chip select signal, thereby to generate an internal delayed chip select signal, and
wherein said internal control signal generator circuit includes a principal portion constructed of a CMOS circuit, and at least one bipolar output transistor, which executes at least one of charge and discharge of a signal output line of at least one circuit in said internal control signal generator circuit.

38. A semiconductor integrated circuit according to claim 37, wherein said internal control signal generator further includes a second bipolar output transistor which executes the other of charge and discharge of said signal output line of said at least one circuit in said internal control signal generator circuit.

39. A semiconductor integrated circuit according to claim 38, wherein said signal circuit further includes means for writing information into said memory cells, wherein said timing circuit further includes means for controlling operations of writing information by said writing means, and wherein said internal control signal generator circuit is further supplied with a write enable signal, thereby to generate a write control signal.

40. A semiconductor integrated circuit comprising:
an input node;
first and second output nodes;
first and second power supply terminals for supplying first and second power supply levels, respectively, to said semiconductor circuit;
a first bipolar transistor having an emitter-collector path coupled between said first power supply terminal and said first output node;
a second bipolar transistor having an emitter-collector path coupled between said second power supply terminal and said first output node;
a first MOS transistor of a first conductivity type having a gate coupled to said input node;

a second MOS transistor of a second conductivity type opposite to said first conductivity type having a gate coupled to said input node, wherein said first and second MOS transistors are coupled in series with one another to have their respective source-drain paths coupled in series between said first output node and said second power supply terminal to form a CMOS inverter circuit, and wherein a base of said second bipolar transistor is coupled to a junction between the respective source-drain paths of said first and second MOS transistors, and further wherein a base of said first bipolar transistor is coupled to said input node;

a third bipolar transistor having an emitter-collector path coupled between said first power supply terminal and said second output node;

a fourth bipolar transistor having an emitter-collector path coupled between said second power supply terminal and said second output node;

a CMOS circuit having an input coupled to said input node and having first and second outputs coupled, respectively, to bases of said third and fourth bipolar transistors, wherein said CMOS circuit includes means for driving said third and fourth bipolar transistors in a push-pull mode of operation; and a discharge MOS transistor coupled to have a source-drain path coupled between a base of said fourth bipolar transistor and said second power supply terminal, said discharge MOS transistor also having a gate coupled to said first output of said CMOS circuit so that discharge of the base capacitance of said fourth bipolar transistor is controlled by said first output of said CMOS circuit which is coupled to the base of said third bipolar transistor, wherein said CMOS circuit includes a third MOS transistor of said first conductivity type having a gate coupled to said input node and having a source-drain path coupled between said first power supply terminal and said first output of said CMOS circuit, a fourth MOS transistor of said second conductivity type having a gate coupled to said input node and having a source-drain path coupled between said second power supply terminal and said first output of said CMOS circuit, and a fifth MOS transistor of said second conductivity type having a gate coupled to said input node and having a source-drain path coupled between said second output node and the second output of said CMOS circuit.

41. A semiconductor integrated circuit device according to claim 40, wherein said discharge MOS transistor is of said second conductivity type.

42. A semiconductor integrated circuit device according to claim 41, wherein said first conductivity type is a P-channel type, and wherein said second conductivity type is an N-channel type.

43. A semiconductor integrated circuit device according to claim 42, wherein said first, second, third and fourth bipolar transistors are NPN bipolar transistors.

44. A semiconductor integrated circuit comprising:
a plurality of memory cells;
an address circuit for selecting a specified memory cell from among said plurality of memory cells;
a signal circuit coupled to said memory cells and including means for respectively reading and writing information from and into said memory cells; and
a timing circuit coupled to said signal circuit for controlling operations of reading and writing information,
wherein said address circuit includes a principal portion constructed of a CMOS circuit, and bipolar output transistors which execute charge and discharge of a signal output line of at least one circuit in said address circuit, and
wherein said address circuit includes a row decoder which executes charge and discharge of word lines of the memory cells, and wherein a plurality of said output bipolar transistors are provided to execute charge and discharge of said word lines.

* * * * *